US006999162B1

(12) United States Patent
Takahashi

(10) Patent No.: US 6,999,162 B1
(45) Date of Patent: Feb. 14, 2006

(54) STAGE DEVICE, EXPOSURE SYSTEM, METHOD OF DEVICE MANUFACTURE, AND DEVICE

(75) Inventor: Masato Takahashi, Kanagawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/830,684

(22) PCT Filed: Oct. 27, 1999

(86) PCT No.: PCT/JP99/05928

§ 371 (c)(1),
(2), (4) Date: Apr. 30, 2001

(87) PCT Pub. No.: WO00/25352

PCT Pub. Date: May 4, 2000

(30) Foreign Application Priority Data

Oct. 28, 1998 (JP) ................................ 10-306862

(51) Int. Cl.
*G03B 27/62* (2006.01)
*G03B 27/42* (2006.01)
*G03B 27/58* (2006.01)

(52) U.S. Cl. ............................ 355/75; 355/53; 355/72

(58) Field of Classification Search .................. 355/75, 355/53, 72; 318/53, 687, 671; 248/550, 248/638; 250/442.11; 310/12; 347/10; 348/550, 638

See application file for complete search history.

(56) References Cited

U.S. PATENT DOCUMENTS

| | | | | |
|---|---|---|---|---|
| 5,610,686 | A * | 3/1997 | Osanai | 355/53 |
| 5,984,448 | A * | 11/1999 | Yanagawa | 347/10 |
| 6,252,234 | B1 * | 6/2001 | Hazelton et al. | 250/442.11 |
| 6,252,314 | B1 * | 6/2001 | Ebinuma | 310/12 |
| 2002/0054280 | A1 | 5/2002 | Tokuda et al. | |

FOREIGN PATENT DOCUMENTS

| | | |
|---|---|---|
| JP | 6-120105 | 4/1994 |
| JP | 10-125593 | 5/1998 |
| JP | 10-270309 | 10/1998 |

* cited by examiner

*Primary Examiner*—Peter B. Kim
(74) *Attorney, Agent, or Firm*—Oblon, Spivak, McClelland, Maier & Neustadt, P.C.

(57) ABSTRACT

A barrel supporting bed (58) for holding a projection optical system (PL), a driving mechanism (86A, 86B) for driving a stage (WST), a frame (84A, 84B) in which a reaction force caused by driving the stage (WST) is transmitted in a non-contact to the supporting bed (58), and a damping member (85) that is arranged on the frame are provided. Therefore, a vibration and a reaction force, which are caused by the reaction force caused by driving the stage, are damped by the damping member and are transmitted to the earth (set floor), thereby making it possible to effectively reduce a force that is transmitted to the supporting bed from the earth. The frame and the supporting bed have an independent relationship with respect to the vibration, so that the reaction force and the vibration of the frame due thereto exert no direct influence on the projection optical system. This results in suppressing an influence on exposure accuracy which is exerted by vibration of components in an apparatus.

37 Claims, 13 Drawing Sheets

STAGE DEVICE, EXPOSURE SYSTEM, METHOD OF DEVICE MANUFACTURE, AND DEVICE

TECHNICAL FIELD

The present invention relates to a stage unit, an exposure apparatus, a device manufacturing method, and a device. More particularly, the present invention relates to a stage unit that is suitable to a precision machine requiring positional controllability of a sample (or a sample stage) with high accuracy, an exposure apparatus used in a lithography process upon manufacturing semiconductor devices (electron devices) such as a semiconductor integrated circuit and a liquid crystal display as the precision machine, an electron device manufacturing method using the exposure apparatus, and a device manufactured by the aforementioned method.

BACKGROUND ART

Conventionally, in a lithography process which is a process in manufacturing a semiconductor device, various exposure apparatuses are used to transfer a circuit pattern formed on a mask or a reticle (hereinlater, generically referred to a "reticle") onto a substrate such as a wafer, or glass plate or the like that is coated with a resist (photoresist).

For example, with the exposure apparatus for semiconductor devices, reduction projection exposure apparatuses that reduce and transfer the pattern formed on a reticle using a projection optical system are mainly used, so as to accomplish the finer minimum line width (device rule) of the pattern required with higher integration of integrated circuits.

Of the reduction projection expose apparatuses, the static type exposure apparatus (so-called stepper) which employs a step-and-repeat method to sequentially transfer the pattern formed on the reticle to a plurality of shot areas on the wafer, or an improved stepper which is the scanning exposure apparatus that employs a step-and-scan method (so-called scanning stepper) disclosed in, for example, Japanese Patent Laid Open No. 08-166043, which synchronously moves the reticle and the wafer in a one-dimensional direction and transfers the retile pattern onto each shot area on the wafer, are well-known.

In these reduction projection exposure apparatuses, a base plate which is to be the base of the apparatus, is first of all, arranged on a floor surface. On the plate, a main column which supports a reticle stage, a wafer stage, and a projection optical system (projection lens) and the like, is arranged via a variation isolator bed which is arranged to isolate a vibration of the floor. With recent reduction projection exposure apparatuses, as the vibration isolator bed, an active vibration isolator bed is employed. The active vibration isolator bed comprises: an air mount of which the internal pressure is adjustable; and an actuator such as a voice coil motor. And, the vibration of the main column is suppressed by controlling the voice coil motor and the like based on measurement values of six accelerometers attached to the main column (mainframe).

With the steppers, after a shot area on the wafer is exposed, exposure is sequentially repeated onto the remaining shot areas. Therefore, a reaction force due to the acceleration and deceleration of the wafer stage (in the case of the stepper) or the reticle stage and the wafer stage (in the case of the scanning stepper) is a factor of vibration of the main column, which in turn caused an unfavorable situation such as creating a positional relationship error between the projection optical system and the wafer.

The error in the positional relationship on alignment and on exposure has consequently been the cause of the pattern being transferred onto a position on the wafer different from a designated value, or in the case in which the positional error includes a vibration component, led to an image blur (increase in the pattern line width).

Accordingly, in order to prevent the pattern being transferred from shifting, or to suppress the image blur, the vibration of the main column needed to be sufficiently damped by the above active vibration isolator bed. For example, in the case of the stepper, alignment operation and exposure operation are to begin after the wafer stage is positioned at a desired place and is sufficiently settled down, whereas in the case of the scanning stepper, the reticle stage and the wafer stage has to be sufficiently settled in synchronous before exposure is performed. Consequently, there are factors of lowering throughput (productivity).

To solve such inconvenience, as disclosed in Japanese Patent Laid Open No. 08-166475, etc., it is known that the reaction force to be generated by movement of the wafer stage is mechanically released to the floor (the earth) by using a frame member. Also, as disclosed in Japanese Patent Laid Open No. 08-330224, etc., it is known that the reaction force to be generated by movement of a reticle stage is mechanically released to the floor (the earth) by using a frame member.

With the increase in size of the wafer in recent yeas, the size of the wafer stage has also increased, making it difficult to secure the throughput to some extent and perform precise exposure even by using the invention disclosed in Japanese Patent Laid Open No. 08-166475 or 08-330224, etc. earlier described. To be more specific, the frame member itself vibrates due to a reaction force which is released to the floor side through the frame member and, on the contrary, this vibration becomes a factor of deterioration in positional controllability of a stage. Also, the reaction force released to the floor might be transmitted to a main column (main body) holding a projection optical system through a vibration isolator, etc. and this might result in a vibration of the main column.

Since the device rule will become finer in the future, and the wafer and the reticle larger in size, it is evident that the vibration caused when the stage is driven will become a more serious problem. Accordingly, the requirement of a new technology to be developed is pressing, to effectively suppress the adverse effects of the vibration of each component affecting the exposure accuracy. Precision machines other than the exposure apparatus also have the similar problem.

The present invention has been made in consideration of the situation described above, and it is the first object of the present invention to provide a stage unit capable of improving positional controllability of a stage by suppressing an influence of a reaction force generated by driving the stage.

Also, the present invention has as its second object to provide an exposure apparatus capable of improving exposure precision and throughput by suppressing an influence on the exposure accuracy exerted by vibrations of components in the apparatus.

Further, the present invention has as its third object to provide a device manufacturing method capable of improving the productivity of electron devices with high integration.

DISCLOSURE OF INVENTION

According to the first aspect of the present invention, there is provided a stage unit comprising: a sample stage that holds a sample; a stage diving mechanism that drives the sample stage in at least one direction; a first transmitting member to which at least one part of the stage driving mechanism is connected and a reaction force caused by driving the sample stage is transmitted; and a first damping member that is provided to the first transmitting member and damps a vibration of the first transmitting member.

In the foregoing, the sample stage is driven by the stage driving mechanism, then, the reaction force caused by the driving is transmitted to the first transmitting member, and the first transmitting member is vibrated. This vibration is damped by the first damping member. As a consequence, it is possible to suppress the vibration caused in the stage driving mechanism due to the vibration of the first transmitting member, thereby enabling improvement in positional controllability (including positioning performance) of the sample stage. The suppression of the vibration of the first transmitting member enables a force transmitted to a floor side via the first transmitting member to be decreased and an influence to the periphery via the first transmitting member can also be suppressed.

In this case, the stage driving mechanism may comprise a stator provided to the first transmitting member and a mover that is driven together with the sample stage by an electromagnetic interaction between the stator and the mover. In such a case, the mover is relatively driven to the stator together with the sample stage and a reaction force of the drive force is induced in the stator, thus causing the vibration of the first transmitting member. However, the vibration is damped by the first damping member and, therefore, deterioration of the positional controllability of the sample stage due to the vibration can be prevented.

In the stage unit according to the present invention, the first damping member may be arranged to a position where a maximum strain of the first transmitting member is generated. In such a case, it is possible to effectively suppress the vibration of the first transmitting member.

With the stage unit according to the present invention, the first damping member is a piezo-electric element having electrodes at both ends and each of the electrodes may be earthed via a resistor. In such a case, a current flows to the resistor by a piezoelectric effect caused in the piezoelectric element due to the vibration of the first transmitting member, thereby enabling a mechanical energy caused by the vibration to be actively transduced into a heat energy. Accordingly, the vibration of the first transmitting member can be effectively damped by the piezoelectric element.

When the first damping member is an electro-mechanical transducer that generates a mechanical strain by applying an electric energy, the stage unit according to the present invention may further comprise a controller that controls the electromechanical transducer in accordance with the reaction force caused by driving the sample stage. In such a case, the controller controls the electromechanical transducer in accordance with a reaction force caused by driving the sample stage, thereby enabling the vibration and deformation of the first transmitting member due to the reaction force to be suppressed.

In this case, the controller may control the electro-mechanical transducer based on an instructing value of a drive force of the sample stage. In such a case, the controller controls the electro-mechanical transducer based on the instructing value of the drive force of the sample stage, thereby enabling the vibration and deformation of the first transmitting member due to the reaction force to be effectively suppressed.

Also, in this case, in a feed-forward manner, the controller may control a voltage applied to the electro-mechanical transducer so that the electromechanical transducer generates a deflection deformation to cancel a deformation caused in the first transmitting member by the reaction force in the first transmitter. In such a case, prior to actually generating the deflection deformation in the first transmitting member, the electromechanical transducer generates the deflection deformation to cancel the deflection deformation in the first transmitter and the deformations are synthesized. This results in actively suppressing the occurrence itself of the vibration of the first transmitting member.

The stage unit according to present invention may further comprise a stage base that movably supports the sample stage and is supported by the first transmitting member. In such a case, the sample stage is driven and, then, a reaction force caused by the driving is applied to the stage base, thereby vibrating the first transmitter that supports the stage base. However, since the vibration is damped by the first damping member, it is possible to suppress an influence which is exerted upon positional controllability of the sample stage by the vibration.

With the stage unit according to present invention, the sample stage can comprise a first stage that moves in the one direction and a second stage that holds the sample and can be relatively moved to the first stage. In such a case, upon movement of the first stage, the reaction force of the drive force is transmitted to the first transmitting member, thus vibrating the first transmitting member. However, the vibration is damped by the first damping member. In this case, if the second stage can be relatively moved in a direction perpendicular to a movement direction of the first stage, the second stage can move in two axial directions perpendicular to each other and can hold the sample.

In this case, the stage unit further can comprise a second damping member in which a reaction force caused by driving the second stage is transmitted via the first stage; a linear actuator that drives the second transmitting member in the one direction; a second damping member that is provided to the second transmitting member and damps a vibration of the second transmitting member due to the reaction force caused by driving the second stage; and a first controller that controls the stage driving mechanism and the linear actuator so that the first stage and the second transmitting member integrally move in the one direction. In such a case, upon movement of the second stage, the reaction force of the drive force of the second stage acts on the first stage, the reaction force is transmitted to the second transmitting member from the first stage, and the second transmitting member is vibrated. However, the vibration is damped by the second damping member. This results in sufficiently decreasing the reaction force caused upon movement of the second stage which is transmitted to the floor surface side via the second transmitting member. Also, the first controller controls the stage driving mechanism and the linear actuator so that the first stage and the second transmitting member integrally move in one direction. Accordingly, the first stage can be driven without problems.

In this case, the second damping member may be arranged to a position where a maximum strain of the second transmitting member is caused. In such a case, the vibration of the second transmitting member can be effectively suppressed.

The stage unit according to the present invention may further comprise a second controller that controls the electromechanical transducer in accordance with the reaction force caused by driving the second stage, when the second damping member that damps the vibration of the second transmitting member is an electro-mechanical transducer that generates a mechanical strain by applying an electric energy. In such a case, the second controller controls the electromechanical transducer in accordance with the reaction force caused by driving the second stage, thereby enabling the vibration and deformation of the second transmitting member to be suppressed.

In this case, the second controller may control the electromechanical transducer based on an instructing value of a drive force of the second stage. In such a case, since the controller controls the electro-mechanical transducer based on the instructing value of the drive force of the second stage. Thus, it is possible to efficiently suppress the vibration and deformation of the second transmitting member caused by the reaction force.

In this case, the second controller may feed-forward control a voltage applied to the electro-mechanical transducer so that the electro-mechanical transducer generates a deflection deformation to cancel a deformation, which is caused in the second transmitting member by the reaction force, in the second transmitting member. In such a case, prior to actual generation of the deflection deformation in the second transmitting member, the electro-mechanical transducer generates the deflection deformation to cancel the deflection deformation in the second transmitting member. The deformations are combined, thus actively suppressing the occurrence itself of the vibration of the second transmitting member.

According to the second aspect of the present invention, there is provided a first exposure apparatus that is characterized by comprising a mask stage unit including a mask stage that moves and holds a mask, as a sample, having a pattern, and a substrate stage unit including a substrate stage that moves and holds a substrate, as a sample, onto which the pattern is transferred, the stage unit of the present invention is used for at least one of the mask stage unit and the substrate stage unit.

In this case, the first exposure apparatus further can comprise a projection optical system that is arranged between the mask and the substrate and projects the pattern onto the substrate. In such a case, the pattern of the mask is projected and transferred onto the substrate via the projection optical system. However, the influence of the vibration is suppressed in such a case as mentioned above. Accordingly, it is possible to precisely transfer an image of the pattern of the mask onto the substrate via the projection optical system.

In the foregoing, with the stage unit of the present invention, it is possible to improve positional controllability (including positioning performance) of the sample stage that holds the mask and the substrate. Also, it is possible to suppress the vibration of the first transmitting member due to the reaction force which is caused by driving the sample stage. This results in decreasing a force transmitted to the floor side via the first transmitting member and in enabling an influence exerted upon the periphery by the force via the floor to be suppressed. As a consequence, according to the present invention, it is possible to improve the positional controllability of at least one of the mask stage and the substrate stage, for example, to improve throughput by reduction in time of positioning and adjusting the sample, and to improve exposure accuracy by suppression of the influence of the vibration.

In this case, the first exposure apparatus further can comprise a projection optical system (PL) that is arranged between the mask (R) and the substrate (W) and projects the pattern onto the substrate. In such a case, the pattern of the mask is projected and transferred onto the substrate via the projection optical system. However, the influence of the vibration is suppressed in such a case as mentioned above. Accordingly, it is possible to precisely transfer an image of the pattern of the mask onto the substrate via the projection optical system.

In this case, the first exposure apparatus further can comprise a holder that is independent of the first transmitting member with respect to a vibration and holds the projection optical system. In such a case, the first transmitting member and the holder that holds the projection optical system have the independent relationship with respect to the vibration. Therefore, little direct influence is exerted upon the projection optical system by the reaction force caused by driving the sample stage and by the vibration of the first transmitting member. On the contrary, the first damping member damps the vibration of the first transmitting member (and a reaction force that becomes a factor thereof) and the damped vibration is transmitted to the earth (set floor), thereby effectively suppressing the influence to transmit the vibration (force) to the holder from the earth. Therefore, the reaction force upon moving (driving) the sample stage becomes no vibration factor of the projection optical system that is held by the holder. Accordingly, the positional shift of the pattern to be transferred or the image blur due to the vibration of the projection optical system can be effectively suppressed, and the exposure accuracy can be improved. Also, by improving positional controllability of the sample stage, acceleration, velocity, and size of the sample stage can be increased, thus improving throughput.

In this case, when the pattern is transferred onto the substrate, the first exposure apparatus may further comprise a controller that synchronously moves the mask and the substrate. In such a case, when the pattern is transferred onto the substrate, the controller synchronously moves the mask and the substrate, thereby transferring the pattern of the mask onto the substrate via the projection optical system with so-called scanning exposure. By improving positional controllability of the sample stage that holds at least one of the mask and the substrate, it is possible to improve tracing performance of the sample to the mask and, thus, it is also possible to improve precision of synchronizing the mask and the substrate and to reduce the synchronous adjusting and determining time. Therefore, the mask pattern can be precisely transferred onto the substrate and throughput can also be improved.

According to the third aspect of the present invention, there is provided a second exposure apparatus that forms a pattern onto a substrate while a stage moves, characterized by comprising: a stage base that movably supports the stage; a counter stage that moves in a direction opposite to the stage in accordance with movement of the stage; a first supporting frame that is arranged independently of the stage base and movably supports the counter stage; and a damping member that is provided to the first supporting frame and damps a vibration of the first supporting frame.

In the foregoing, when the stage moves, the counter stage moves on the first supporting frame in the direction opposite to the stage in accordance with the movement of the stage. Herein, if a friction force between the stage and the stage base is null and a friction forces among the stage, the counter stage, and the first supporting frame are null, momentum of a system including the stage, the stage base, the counter stage, and the supporting frame is conserved. A reaction force upon accelerating or decelerating the stage is absorbed by the movement of the counter stage. Hence, the vibration of the first supporting frame can be effectively prevented by the reaction force. The stage and the counter stage move relatively in the opposite direction and the center of gravity of the overall system including the stage, the stage base, the counter stage, and the first supporting frame is maintained at a predetermined position. Thus, no offset load is caused by movement of the center of gravity. However, it is difficult to actually make the friction force to be null. And, since lines of action of forces, etc. are varied and the like, a reaction force acting to the first supporting frame, etc. are not null and a vibration is caused in the first supporting frame due to the slight remaining reaction force. However, the vibration of the first supporting frame (and a reaction force as a factor thereof) are damped by the damping member. Accordingly, it is possible to almost certainly prevent a bad influence upon exposure exerted by the reaction force upon moving (driving) the state and the vibration due thereto.

In the second exposure apparatus of the present invention, the stage may be a substrate stage that moves and holds the substrate. Alternatively, the stage may be a mask stage that moves and holds the mask on which the pattern is formed.

The second exposure apparatus of the present invention further can comprise a driver that drives the stage and at least one part of which is connected to the counter stage.

In this case, the driver may have a mover and a stator and the stator may be attached to the counter stage. In such a case, when the driver generates a drive force and, then, drives the mover together with the stage, the stator is moved to the opposite integrally with the counter stage by a reaction force of the drive force and, thus, the reaction force is absorbed or suppressed.

The second exposure apparatus of the present invention further can comprise a projection optical system that projects the pattern onto the substrate and a second supporting frame that is provided independently of the first supporting frame with respect to a vibration and supports the projection optical system. In the second exposure apparatus of the present invention, as mentioned above, the counter stage moves in the direction opposite to the stage in accordance with the movement of the stage and the reaction force is absorbed. The damping member damps a reaction force that cannot be absorbed and a vibration of the first supporting frame due thereto. Hence, it is possible to effectively prevent the reaction force accompanied by the driving of the stage from becoming a vibration factor of the projection optical system supported by the second supporting frame different from the first supporting frame. The first supporting frame and the second supporting frame have an independent relationship in respect to the vibration, so that there is little danger that, if a slight vibration remains in the first supporting frame due to the reaction force by driving the stage, this vibration becomes the vibration factor of the projection optical system. Accordingly, the positional shift of the pattern to be transferred or the image blur caused, due to the vibration of the projection optical system, can be effectively suppressed, and the exposure accuracy can be improved. And, at least one of the mask stage and the substrate stage can be increased in size and in acceleration and velocity, thereby also improving throughput.

In a lithography process, exposure is performed by using the exposure apparatus of the present invention. Thereby, a plurality of layers of patterns can be formed on the substrate with high overlapping precision. Therefore, microdevices with higher integration can be manufactured with high yield, and the productivity can be improved. Accordingly, according to another aspect of the present invention, there is provided a device manufacturing method using the exposure apparatus of the present invention and a device manufactured by the device manufacturing method.

BEST MODE FOR CARRYING OUT THE INVENTION

First Embodiment

The first embodiment of the present invention will be described below with reference to FIGS. 1 to 5.

Figure 1:
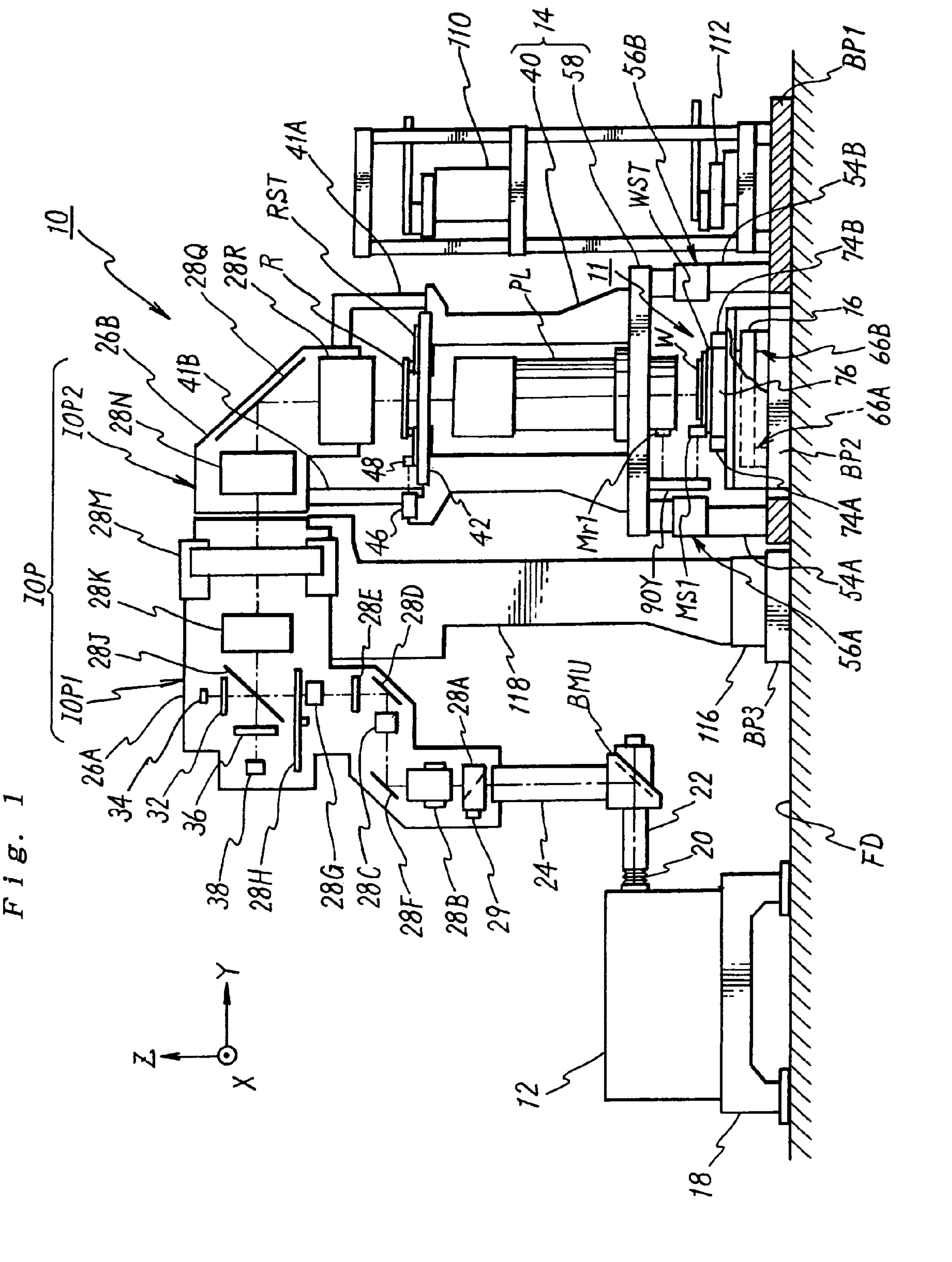
FIG. 1 is a view schematically showing the constitution of an exposure apparatus according to the first embodiment of the present invention.

FIG. 1 schematically shows the overall constitution of an exposure apparatus 10 according to the first embodiment. The exposure apparatus 10 is a scanning exposure apparatus based on the step-and-scan method, that is a so-called scanning stepper, which synchronously moves a reticle R as a mask and a wafer W as a base (and a sample) in a one-dimensional direction (in this case, the Y-axis direction) and transfers circuit patterns formed on the reticle R onto each shot area on the wafer W via a projection optical system PL.

The exposure apparatus 10 comprises: a light source 12; an illumination optical system IOP which illuminates the reticle R with illumination light from the light source 12; a reticle stage RST serving as a mask stage which holds the reticle R; the projection optical system PL which projects illumination light (ultraviolet pulse light) emitted from the reticle R onto the wafer W; a stage unit 11 including a wafer stage WST serving as a substrate stage (and a sample stage) which hold the wafer W and a stage supporting bed 16 which supports the wafer stage WST, etc.; and a main column 14, as a holder, which holds the projection optical system PL and the reticle stage RST; a vibration isolation system which suppresses or removes vibrations of the main column 14 and stage supporting bed 16, etc.; a control system which controls each component; and the like.

As the light source 12, an ArF excimer laser light source is used, which emits an ArF excimer laser beam narrow banded between the wavelengths of 192 to 194 nm so as to avoid the absorption range by oxygen. The main portion of the light source 12 is arranged on a floor surface FD in a clean room of a semiconductor manufacturing site via a vibration isolator 18. In the light source 12, a light source controller 13 (not shown in FIG. 1, refer to FIG. 3) is also arranged. This light source controller 13 controls an oscillation center wavelength and a spectral line width (half-bandwidth) of a pulse ultraviolet beam emitted, a trigger timing of the pulse oscillation, and gases in a laser chamber, and the like, based on instructions from a main controller 50 (not shown in FIG. 1, refer to FIG. 3) which will be described later.

The light source 12 can be disposed in a separate room (service room) having a lower degree of cleanliness than that of a clean room, or in a utility space provided underneath the floor of the clean room.

The light source 12 is connected to one end (an incident end) of a beam matching unit BMU via light-shielding bellows 20 and pipe 22. The other end (the emitting end) of the beam matching unit BMU is connected to the illumination optical system IOP via a pipe 24.

Within the beam matching unit BMU, a plurality of movable reflecting mirrors (omitted in Figs.) are arranged. The main controller 50 uses these movable reflecting mirrors, to perform positional matching of the optical path of the narrow banded ultraviolet pulse light (ArF excimer laser beam) emitted from the light source 12 and incident via the bellows 20 and the pipe 22 with a first partial illumination optical system IOP1 which will be discussed hereinbelow.

The illumination optical system IOP comprises two parts of the first partial illumination optical system IOP1 and a second partial illumination optical system IOP2. The first and second partial illumination optical systems IOP1 and IOP2 comprise illumination system housings 26A and 26B by which the inside becomes airtight from ambient air, respectively. The inside of the illumination system housings 26A and 26B is filled with air (oxygen) which concentration does not exceed a few percent, and is preferably filled with clean dry nitrogen gas ($N_2$) or a helium gas (He) having an air (oxygen) concentration less than 1%.

The one illumination system housing 26A houses therein: a variable beam attenuator 28A; a beam shaping optical system 28B; a first fly-eye lens system 28C; a vibrating mirror 28D; a condenser lens 28E; a mirror 28F; a second fly-eye lens system 28G; an illumination system aperture stop plate 28H; a beam splitter 28J; a first relay lens 28K; and a reticle blind mechanism 28M, etc., in a predetermined positional relationship thereamong. The other illumination system housing 26B houses therein: a second relay lens 28N; a mirror 28Q; and a main condenser lens system 28R, etc., in a predetermined positional relationship thereamong.

Herein, a description is given of the respective components mentioned above in the illumination system housing 26A and the illumination system housing 26B. The variable beam attenuator 28A adjusts an average energy per each pulse ultraviolet beam. As the variable beam attenuator 28, for example, one in which a plurality of optical filters having different beam attenuating ratios are arranged so that they can be switched to change the beam attenuating ratio gradually, can be used. Or, another which continuously changes the beam attenuating ratio by adjusting the degree of overlapping of two optical filters whose transmittance continuously vary can be used. The details of an example of such a variable beam attenuator is disclosed in, for example Japanese Patent Laid Open No. 03-179357, and the corresponding U.S. Pat. No. 5,191,374. As long as the national laws in designated states or elected states, to which this international application is applied, permit, the disclosures cited above are fully incorporated herein by reference.

The optical filter structuring the variable beam attenuator 28A is driven by a driving mechanism 29 including a motor controlled by an illumination controller 30 (not shown in FIG. 1, refer to FIG. 3) under the control of the main controller 50, which will be described later.

The beam shaping optical system 28B shapes a cross-sectional shape of a pulse ultraviolet beam adsted to a predetermined peak intensity by the variable beam attenuator 28A, so that it becomes similar to the entire shape of an incident end of the first fly-eye lens system 28C constituting an incident end of a double fly-eye lens system provided behind the optical path of the pulse ultraviolet light, which will be explained. This improves the incident efficiency of the pulse ultraviolet beam on the first fly-eye lens 28C. The beam shaping optical system 28B is, for example, structured of a cylinder lens, a beam expander (omitted in Figs.), etc.

The double fly-eye lens system functions to make the intensity distribution of the illuminating light uniform. It is configured of the first fly-eye lens system 28C, the condenser lens system 28E, and the second fly-eye lens system 28G which are sequentially arranged on the optical path of the pulse ultraviolet beam behind the beam forming optical system 28B. In this case, between the first fly-eye lens system 28C and the condenser lens system 28E, the vibrating mirror 28D for smoothing interference fringes or tiny speckles caused on an irradiated surface (reticle surface or wafer surface) is arranged. A vibration of the vibrating mirror 28D (deflection angle) is controlled by the illumination controller 30, which is under the control of the main controller 50 via a driving system not shown in Figs.

The details of a similar structure with a combination of a double fly-eye lens system and a vibrating mirror as in present embodiment, is disclosed in, for example, Japanese Patent Laid Open Nos. 01-235289 and 07-142354, and in the corresponding U.S. Pat. Nos. 5,307,207 and 5,534,970, etc. As long as the national laws in designated states or elected states, to which this international application is applied, permit, the disclosures cited above are fully incorporated herein by reference.

An illuminating system aperture stop plate 28H composed of a disc-shaped member, is arranged near an emitting surface of the second fly-eye lens system 28G. On this illuminating system aperture stop plate 28H, a plurality of aperture stops are arranged at substantially equal angular intervals. The aperture stops include an ordinary circular aperture, a small circular-shaped aperture for reducing a σ-value, which is a coherence factor, a ring-shaped aperture for ring-shaped illumination, a deformed aperture in which, for example, four apertures are arranged so that each central position differs from one another for a modified illumination method.

The beam splitter 28J having a large transmittance and a small reflectance is arranged downstream of the illumination system aperture stop 28H on the optical path of the ultraviolet pulse light. Further downstream of the optical path, the first relay lens 28K and the reticle blind mechanism 28M are sequentially arranged.

The reticle blind mechanism 28M is arranged on a surface slightly apart from a conjugate plane with the pattern surface of the reticle R. The reticle blind mechanism 28M includes a fixed reticle blind on which an opening of a predetermined shape is formed so as to define an illumination area on the reticle R, and also includes a movable reticle blind, which is arranged in the vicinity of the fixed reticle blind and has an opening portion of which position and width is variable in a direction corresponding to the scanning direction. The opening portion of the fixed reticle blind is located in the center within the circular field view of the projection optical system PL, and formed in a slit or a rectangular shape extending linearly in the X-axis direction which is perpendicular to the moving direction of the reticle R (Y-axis direction) during scanning exposure.

In this case, by further limiting the illumination area with the movable reticle blind when starting and completing scanning exposure, exposure of unnecessary portions can be avoided. The movable reticle blind is under the control of the main controller 50 via a driving system (not shown in Figs.).

A relay optical system is composed of the second relay lens 28N housed in the illumination system housing 26B as well as the first relay lens 28K. Arranged on the optical path of the ultraviolet pulse light downstream of the second relay lens 28N, is a mirror 28Q which reflects the ultraviolet pulse light passing through the second relay lens 28N to the reticle R. The main condenser lens system 28R is arranged on the optical path of the ultraviolet pulse light downstream of the mirror 28Q.

In the above-explained constitution, an incident surface of the first fly-eye lens system 28C, an incident surface of the second fly-eye lens system 28G, an arrangement surface of the movable reticle blind of the reticle blind mechanism 28M, and a pattern surface of the reticle R are arranged optically conjugated with each other. A light source surface formed on an emitting side of the first fly-eye lens system 28C, a light source surface formed on an emitting side of the second fly-eye lens system 28G, and a Fourier transform surface of the projection optical system PL (exit pupil surface) are arranged optically conjugated with each other, forming a Koehler illumination system.

A brief description is given of operation of the thus-constituted illumination optical system IOP, i.e., the first partial illumination optical system IOP1 and the second partial illumination optical system IOP2. The ultraviolet pulse light from the light source 12 strikes the first partial illumination optical system IOP2 via the beam matching unit BMU and, then, this ultraviolet pulse light is adjusted to a predetermined peak intensity by the variable beam attenuator 28A. Thereafter, the ultraviolet pulse light strikes the beam shaping optical system 28B. The beam shaping optical system 28B shapes the sectional shape of the ultraviolet pulse light to be efficiently incident on the first fly-eye lens system 28C therebehind. Subsequently, the ultraviolet pulse light is incident on the first fly-eye lens system 28C via the mirror 28F, thus forming a planar light source, that is, a secondary light source comprising many light source images (point light sources) on the emitting side of the first fly-eye lens system 28C. The ultraviolet pulse light released from each of these multiple point light sources enters the second fly-eye lens system 28G via the condenser lens system 28E and the vibrating mirror 28D which reduces speckles caused by coherence of the light source. As a result, a tertiary light source is formed in which multiple fine light source images are uniformly distributed within an area of a predetermined shape at the emitting end of the second fly-eye lens system 28G. The ultraviolet pulse light emitted from this tertiary light source passes through an aperture stop on the illuminating system aperture stop plate 28H, and then reaches the beam splitter 28J having a large transmittance and a small reflectivity.

The ultraviolet pulse light serving as exposure light having been reflected at the beam splitter 28J, passes through the first relay lens system 28K, and illuminates the opening portion of the fixed reticle blind, which makes up the reticle blind mechanism 28M, with a uniform intensity distribution. However, on the intensity distribution, interference fringes or tiny speckles that depend on the coherence of the ultraviolet pulse light from the light source 12 can be superimposed by a contrast of several percent. Accordingly, on the wafer surface, an exposure-amount variation may occur due to the interference fringes or tiny speckles. The exposure-amount variation, however, is smoothed by vibrating the vibrating mirror 28D in sync with the movement of the reticle R and wafer W during scanning exposure and the oscillation of the ultraviolet pulse light, as is disclosed in the Japanese Patent Laid Open No. 07-142354, and the corresponding U.S. Pat. No. 5,534,970, referred to earlier.

The ultraviolet pulse light, having passed through the opening portion of the fixed reticle blind, then passes through the movable reticle blind and the second relay lens 28N, and then reaches the mirror 28Q where the optical path is deflected vertically downward. The ultraviolet pulse light then proceeds through the main condenser lens system 28R to illuminate a predetermined illumination area (a slit-shaped or rectangular illumination area extending linearly in the X-axis direction) on the reticle R held on the reticle stage RST, and illuminates the area with a uniform illuminance distribution. The illumination light irradiated on the reticle R is a rectangular shaped slit, and is set so as to extend in the X-axis direction (non-scanning direction) in the center portion of the circular projection view of the projection optical system PL shown in FIG. 1. The width of the illumination light in the Y-axis direction (scanning direction) is set almost constant.

Moreover, the illumination system housing 26A constituting the first partial illumination optical system IOP1 houses therein: a condenser lens 32; an integrator sensor 34 comprising a photo-electric conversion element; a condenser lens 36; and a reflection light monitor 38 comprising a photo-electric conversion element (photodetector) alike to that of the integrator sensor 34, etc. Herein, a description is given of the integrator sensor 34, etc. The ultraviolet pulse light passes through the beam splitter 28J, is incident on the integrator sensor 34 via the condenser lens 32, and is photo-electrically converted in the integrator sensor 34. A photo-electric conversion signal of the integrator sensor 34 is sent to the main controller 50, via a peak hold circuit and an A/D converter (not shown in Figs.). As the integrator sensor 34, for example, a PIN-type photodiode having sensitivity in the far ultraviolet region as well as a quick-response frequency for detecting the emitted pulse beam of the light source 12 can be used. The correlation coefficient between the output of the integrator sensor 34 and the illuminance (exposure amount) of the ultraviolet pulse light on the surface of the wafer W is obtained in advance, and stored in the memory in the main controller 50.

The condenser lens 36 and the reflection light monitor 38 are disposed on the optical path of the reflection light from the reticle R side in the illumination system housing 26A. The reflection light from the pattern surface of the reticle R passes through the main condenser lens system 28R, mirror 28Q, second relay lens 28N, movable reticle blind, opening portion of the fixed reticle blind, and first relay lens 28K. And, the beam splitter 28J transmits the light. The transmitted light is incident on the reflection light monitor 38 via the condenser lens 36 and, then, the incident light is photo-electrically converted. The photo-electric conversion signal of the reflection light monitor 38 is sent to the main controller 50 via the peak hold circuit and the A/D converter (not shown in Figs.). The reflection light monitor 38 is mainly used to measure the transmittance of the reticle R.

A description will be given of the supporting structures, etc. of the illumination system housings 26A and 26B later on.

The reticle stage RST is arranged on the reticle base supporting bed 42, which is fixed horizontally above a supporting column 40 that makes up the main column 14 which will be described later on. The reticle stage RST is linearly driven with large strokes in the Y-direction on the reticle base supporting bed 42, and can also be finely driven in the X-direction and the θZ-direction (rotational direction around the Z-axis).

Figure 4:
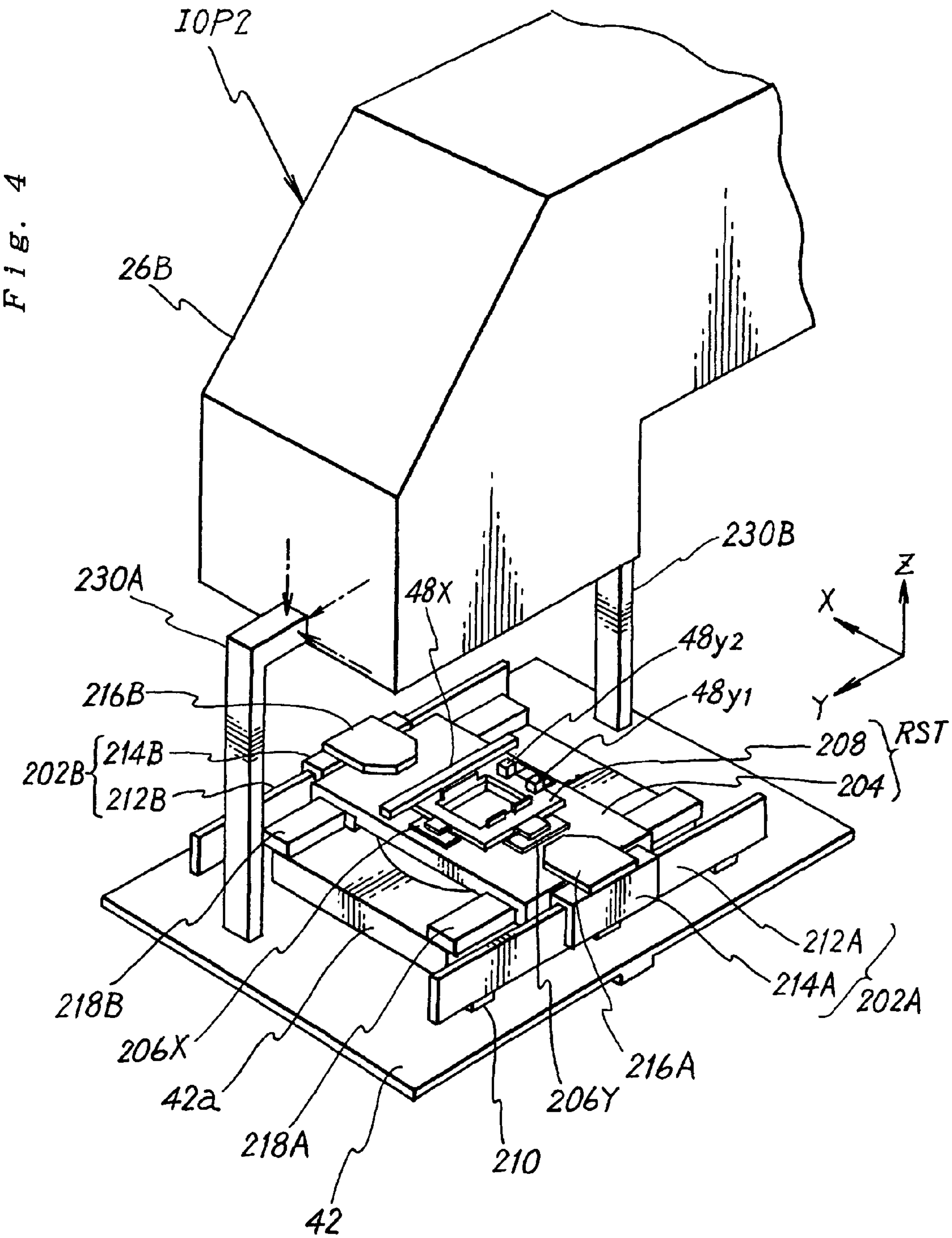
FIG. 4 is a perspective view showing the vicinity of a reticle stage in FIG. 1.

More particularly, as shown in FIG. 4, the structure of the reticle stage RST includes: a reticle coarse movement stage 204 which is driven with a predetermined stroke in the Y-direction by a pair of Y linear motors 202A and 202B on the reticle base supporting bed 42; and a reticle fine movement stage 208 which is finely driven in the X-, Y-, and θZ-direction by a pair of X voice coil motors 206X and a pair of Y voice coil motors 206Y at least parts of which are connected to the reticle coarse movement stage 204.

The one Y linear motor 202A is made up of a stator 212A, which is supported by air-levitation with a plurality of air bearings (air-pads) 210 serving as non-contact bearings and extending in the Y-axis direction, and a mover 214A fixed to the reticle coarse movement stage 204 via a coupling member 216A. The other Y linear motor 202B, likewise with the Y linear motor 202A, is made up of a stator 212B, which is supported on the reticle base supporting bed 42 by air-levitation with a plurality of air bearings (not shown in Figs.) and extending in the Y-axis direction, and a mover 214B fixed to the reticle coarse movement stage 204 via a coupling member 216B.

The reticle coarse movement stage 204 is guided in the Y-axis direction by a pair of Y guides 218A and 218B which extends in the Y-axis direction and is fixed on the upper surface of an upward projecting portion 42*a* formed in the center portion of the reticle base supporting bed 42. The reticle coarse movement stage 204 is supported in a non-contact manner by air bearings (not shown in Figs.) on these Y guides 218A and 218B.

On the reticle fine movement stage 208, an opening is formed in the center portion, and the reticle R is held by suction within the opening via a vacuum chuck not shown in Figs.

In this case, when the reticle coarse movement stage 204 moves integrally with the reticle fine movement stage 208 in the scanning direction (Y-axis direction), the movers 214A and 214B of the Y linear motors 202A and 202B attached to the reticle coarse movement stage 204 and the stator 212A and 212B relatively move in the opposite direction. That is, the reticle stage RST and the stator 212A and 212B relatively move in the opposite direction. In the case wherein a friction between the reticle stage RST, the stator 212A, the stator 212B, and the reticle base supporting bed 42 is zero, the law of conservation of momentum is satisfied, and the movement amount of the stators 212A and 212B accompanying the movement of the reticle stage RST is determined by the weight ratio of the entire reticle stage RST (the reticle coarse movement stage 204, the coupling members 216A and 216B, the movers 214A and 214B, the reticle fine movement stage 208, and the reticle R and the like) and the entire stator (the stators 212A and 212B, the air bearings 210, and the like). The reaction force generated by the acceleration of the reticle stage RST moving in the scanning direction is absorbed by the movement of the stator 212A and 212B, therefore, the vibration of the reticle base supporting bed 42 can be effectively suppressed by the reaction force. In addition, since the reticle stage RST and the stator 212A and 212B move in the opposite direction to each other, gravity center of the system including the reticle stage RST and the reticle base supporting bed 42 is kept at a predetermined position. Thus, the offset load due to the shift in the position of gravity center does not occur. The details of such a structure, is disclosed in, for example, Japanese Patent Laid Open No. 08-63231, and the corresponding U.S. application Ser. No. 09/260,544. As long as the national laws in designated states or elected states, to which this international application is applied, permit, the disclosures cited above are fully incorporated herein by reference.

Referring back to FIG. 1, on a part of the reticle stage RST, a movable mirror 48 is arranged. This movable mirror 48 reflects measurement beams from a reticle laser interferometer 46 serving as a positional detection unit to measure the position and the moving amount of the reticle stage RST. The reticle laser interferometer 46 is fixed to the upper end portion of the supporting column 40.

More specifically speaking, as shown in FIG. 4, on the edge portion of the reticle fine movement stage 208 in the (−Y)-direction, a pair of Y movable mirrors 48$y_1$ and 48$y_2$ composed of corner cubes are fixed, and on the edge portion of the reticle fine movement stage 208 in the (+X)-direction, a movable mirror 48*x*, which is a flat mirror extending in the Y-axis direction, is fixed. And on the upper end portion of the supporting column 40, three laser interferometers that irradiate the measurement beams onto the respective movable mirrors 48$y_1$, 48$y_2$, and 48*x*, are fixed. In FIG. 1, they are representatively shown as the reticle laser interferometer 46 and the movable mirror 48. The fixed mirrors, each of which corresponds to each laser interferometer, are arranged on the side surface of the barrel of the projection optical system PL, or within each the main body of each interferometer. The positional measurement of the reticle stage RST (to be more specific, the reticle fine movement stage 208) is performed by the three reticle laser interferometers in the X-, Y-, and θZ-directions with the projection optical system PL (or a portion of the main column) as the datum. However, in the following description, for the sake of convenience, the positional measurement in the X-, Y-, and θZ-directions are individually performed at the same time by the reticle laser interferometer 46, with the projection optical system PL (or a portion of the main column) as the datum. Also, in the following description, it is assumed that the Y linear motors 202A and 202B, the pair of X voice coil motors 206X, and the pair of Y voice coil motors 206Y are making up a driver 44 (refer to FIG. 3) which drives the reticle stage RST in the X-, Y-, and Z-directions, as the need arises.

Figure 3:
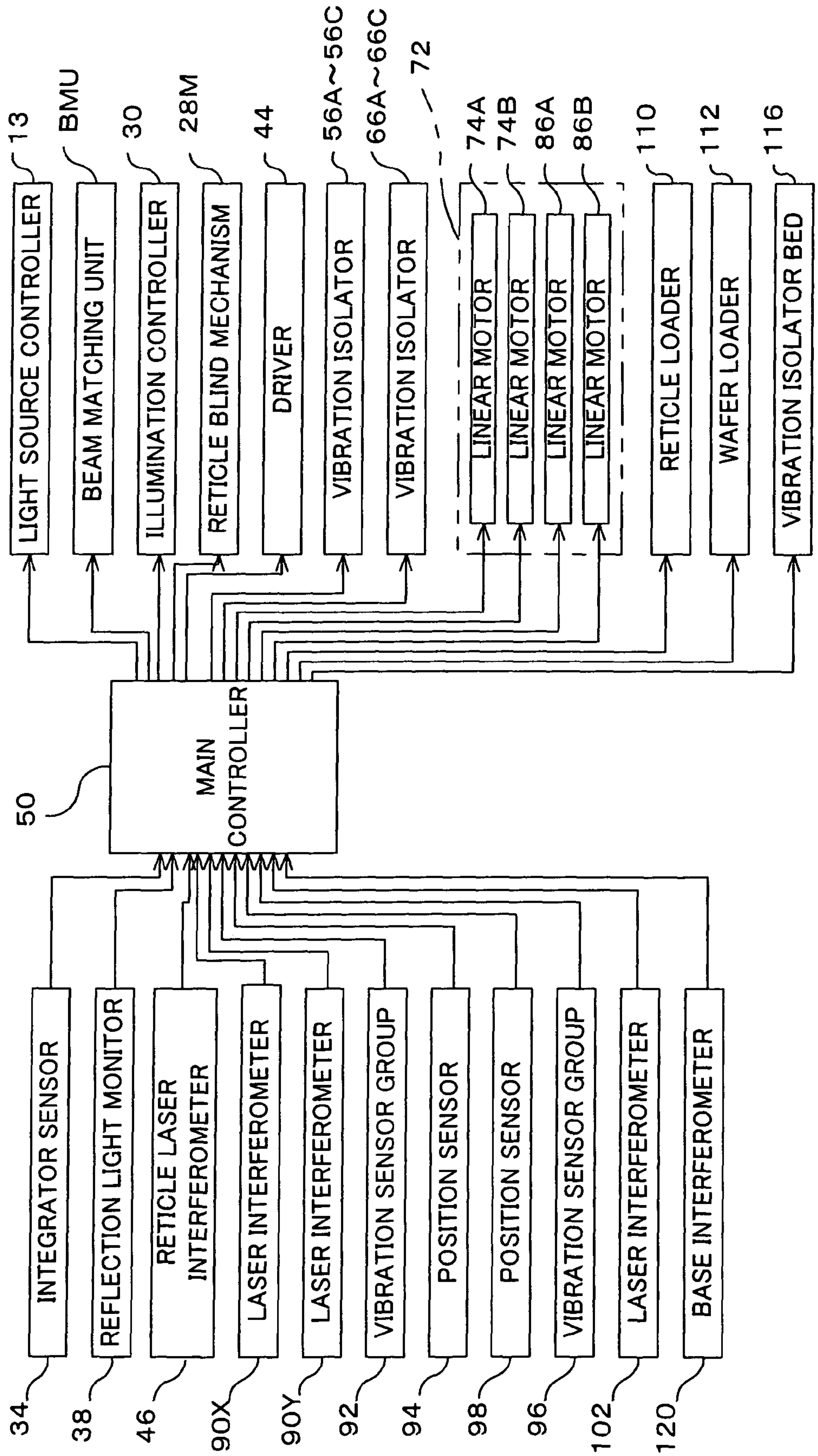
FIG. 3 is a block diagram schematically showing the constitution of a control system of the apparatus in FIG. 1.

The positional information (or the velocity information) of the reticle stage RST (namely, the reticle R) measured by the reticle laser interferometer 46 is sent to the main controller 50 (refer to FIG. 3). The main controller 50 controls the linear motors and voice coil motors which structure the driver 44, so that the positional information (or velocity information) outputted from the reticle laser interferometer 46 coincides with the instructing values (target position, target velocity).

Referring back to FIG. 1, as the projection optical system PL, for example, a refraction optical system structured of only refraction optical elements (lens elements) made of quartz or fluorite as optical glass material with a reduction magnification of ¼ (or ⅕) is used. This system is double telecentric on both of an object surface (reticle R) side and an image surface (wafer W) side and has a circular projection field. Therefore, when the ultraviolet pulse light is irradiated on the reticle R, the light flux of a formed image from the portion irradiated by the ultraviolet pulse light of the circuit pattern area on the reticle R is incident on the projection optical system PL. Then, a partially inverted image of the circuit pattern is formed in the center of the circular field on the image surface side of the projection optical system PL, and is limited in a slit shape or a rectangular shape (a polygonal shape) upon each irradiation of the ultraviolet pulse light. With this operation, the partial inverted image of the circuit pattern projected is reduced and transferred onto a resist layer applied on the surface of a shot area among a plurality of shot areas on the wafer W arranged at the imaging surface of the projection optical system PL.

The projection optical system PL may, of course, be a so-called catadioptric system which is a system with reflection optical elements (a concave mirror and a beam splitter and the like) and refraction optical elements combined, which details are disclosed in, for example, Japanese Patent Laid Open No. 03-282527, and the corresponding U.S. Pat. No. 5,220,454. As long as the national laws in designated states or elected states, to which this international application is applied, permit, the disclosures cited above are fully incorporated herein by reference.

The main column 14 consists of three struts 54A to 54C (the strut 54C in the depth of FIG. 1 is not shown, refer to FIG. 2), which are arranged on the first base plate BP1 serving as a first base plate BP1 and the datum of the apparatus arranged horizontally on the floor surface FD, the barrel supporting bed 58 which is supported almost horizontally via the vibration isolators 56A to 56C (the vibration isolator 56C in the depth of FIG. 1 is not shown, refer to FIG. 2) fixed on the upper portion of the struts 54A to 54C, and the supporting column 40 which stands on the barrel supporting bed 58. In the present embodiment, fixed onto the upper surface of the supporting column 40, are supporting members 41A and 41B for supporting the illumination system housing 26B of the second partial illumination optical system IOP2.

As the base plate BP1, in the present embodiment, a rectangular-shaped member which has a rectangular opening formed in a planar view, that is a rectangular-shaped frame member is used.

Figure 2:
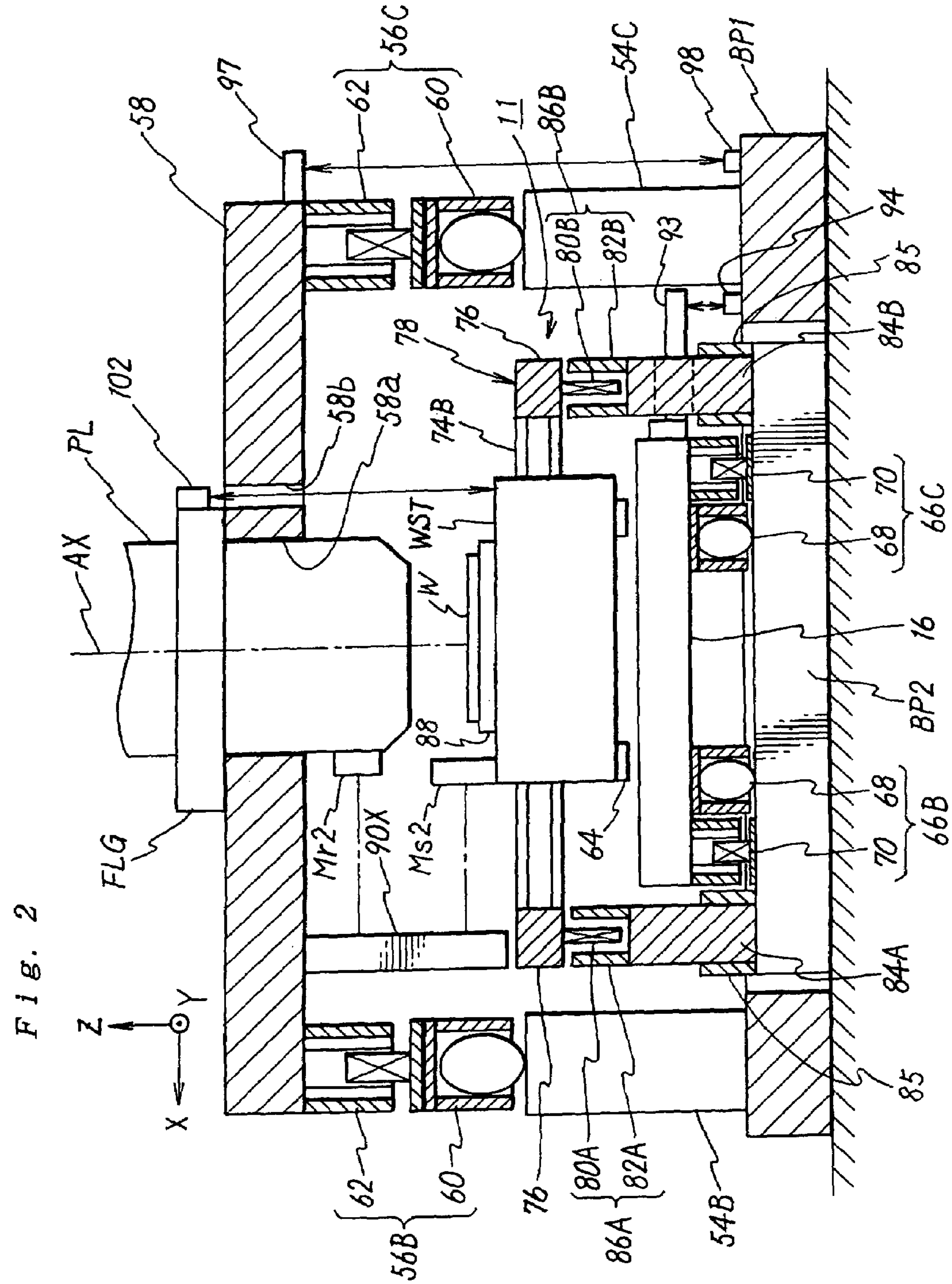
FIG. 2 is a partially sectional view of the right side view of FIG. 1, which shows the constitution of a portion of a main column in the apparatus in FIG. 1 below a barrel supporting bed.

FIG. 2 shows the structure below the barrel supporting bed 58 which makes up a part of the main column 14 of the exposure apparatus 10 in FIG. 1. It is the right side view of FIG. 1 and partially sectioned. As is shown in FIG. 2, the vibration isolator 56B includes an air mount 60 of which the internal pressure is adjustable and a voice coil motor 62 that are arranged in series on top of the strut 54B. The remaining vibration isolators 56A and 56C are similarly arranged, with an air mount 60 and a voice coil motor 62 arranged in series on top of the struts 54A and 54C. And by these vibration isolators 56A to 56C, a small vibration travelling from the floor surface FD to the barrel supporting bed 58 via the first base plate BP1 and the struts 54A to 54C is isolated to be at a micro-G level.

The barrel supporting bed 58 is composed of a casting or the like, and the projection optical system PL is inserted from above, in a circular opening 58*a* around the center portion of the barrel supporting bed 58, with the direction of the optical axis AX of the projection optical system PL as the Z-axis direction. Around the periphery of the barrel portion of the projection optical system PL, a flange FLG is provided, integrally connected with the barrel portion. As the material of the flange FLG, a material having a low thermal expansion, such as Inver (a heat resistant alloy made of nickel 36%, manganese 0.25%, and iron including a small amount of carbon and other elements) is used. The flange FLG structures a so-called kinematic supporting mount, which supports the projection optical system PL via points, a surface, a V-groove against the barrel supporting bed 58. Employment of such a kinematic support mount simplifies the incorporation of the projection optical system PL to the barrel supporting bed 58, and moreover there is an advantage of reduction of stress due to the vibration of the barrel supporting bed 58 and the projection optical system PL and due to the change of temperature, and posture.

Next, the structure of the vicinity of the wafer stage WST will be respectively described referring to FIG. 1 and FIG. 2.

The stage unit 11 comprises: a driver 72 (not shown in FIG. 1 and refer to FIG. 3) serving as a stage driving mechanism (and a substrate driving mechanism) to drive the wafer stage WST to hold the wafer W and the wafer stage WST in the XY two-dimensional direction; and the stage supporting bed 16 serving as a stage base for movably supporting the wafer stage WST, etc.

To be more specific, as shown in FIG. 2, on the bottom surface of the wafer stage WST, a plurality of air bearings (air pads) 64 as non-contact bearings are fixed, and by these air bearings 64, the wafer stage WST is supported by air levitation on the stage supporting bed 16 with a clearance around several microns.

The stage supporting bed 16 is held almost horizontally via three vibration isolators 66A to 66C (the vibration isolator 66C in the depth of FIG. 1, is not shown, refer to FIG. 2) isolator including active actuators, above the second base plate BP2. The second base plate BP2 is arranged on the floor surface FD, and is arranged within the rectangular opening portion of the first base plate BP1 mentioned earlier. The vibration isolator 66B, as shown in FIG. 2, includes an air mount 68 and a voice coil motor 70. The remaining vibration isolators 66A and 66C are similarly arranged, with the air mount 68 and voice coil motor 70. And, by these vibration isolators 66A to 66C, the small vibration travelling from the floor surface FD to the stage supporting bed 16 via the second base plate BP2 is isolated to be at a micro-G level.

In the wafer stage WST, the stage supporting bed 16 is driven in the XY two-dimensional direction by the driver 72 (not shown in FIG. 1, refer to FIG. 3) that includes two sets of linear motors. More particularly, the pair of linear motors 74A and 74B shown in FIG. 1, drives the wafer stage WST in the X-direction. The stators of these linear motors 74A and 74B are arranged on both outer sides of the wafer stage WST in the Y-direction, and extend along in the X-direction. The both end portions in the X-direction are connected to a pair of coupling members 76, and form a rectangular frame 78 (refer to FIG. 2). The movers of the linear motors 74A and 74B are arranged projecting out on both outer sides of the wafer stage WST in the Y-direction.

In addition, as is shown in FIG. 2, on the lower end surface of the pair of coupling members 76 or the linear motors 74A and 74B that make up the frame 78, armature units 80A and 80B are respectively arranged, and, corresponding to these armature units, a pair of magnetic units 82A and 82B are arranged extending in the Y-direction. These magnetic units 82A and 82B are fixed on the upper surface of a pair of reaction frames 84A and 84B which are also arranged extending in the Y-direction on the upper surface of the second base plate BP2. In this case, the armature unit 80A and the magnetic unit 82A structure a linear motor 86A of a moving coil type and, similarly, the armature unit 80B and the magnetic unit 82B structure a linear motor 86B, also a moving coil type. And by these linear motors 86A and 86B, the wafer stage WST is driven in the Y-direction integrally with the frame 78.

That is, in the present embodiment, the linear motors 86A and 86B constituting the driver 72 as the stage driving mechanism (and substrate driving mechanism) include: the magneto units 82A and 82B, serving as stators which are provided on upper surfaces of the reaction frames 84A and 84B; the armature units 80A and 80B serving as movers which are driven in the Y-direction together with the wafer stage WST by an electro-magnetic interaction (more specifically, Lorentz force) between the stators 82A and 82B.

In this manner, the driver 72 is structured, which includes the two sets of linear motors 74A, 74B, 86A, and 86B. And, by this driver 72, the wafer stage WST is driven two-dimensionally on an XY-plane which is parallel to the image plane of the projection optical system PL. In the present embodiment, since the driver 72 is supported independently by the reaction frames 84A and 84B arranged on the outer side of the stage supporting bed 16, the reaction force caused when the wafer stage WST is accelerated or decelerated within the XY plane travels to the base plate BP2 via the reaction frames 84A and 84B, but does not directly travel to the stage supporting bed 16. That is, in the first embodiment, an independent relationship is established between the stage supporting bed 16 and the wafer stage WST in regard of the vibration.

However, as discussed above, the reaction force caused when the wafer stage WST is accelerated or decelerated increases in accordance with the increase in size and in acceleration and velocity. This reaction force vibrates the reaction frames 84A and 84B, the vibration (and force) travels to the base plate BP2, and is damped by the vibration isolators 66A to 66C. After that, the vibration is transmitted to the stage supporting bed 16 and then this can become a vibration factor of the stage supporting bed 16. For example, consider a case wherein the wafer stage WST is driven in the Y-direction upon scanning exposure or the like. The vibrations of the above reaction frames 84A and 84B can become vibration factors of the stators 82A and 82B when the wafer stage moves at a uniform velocity.

Alternatively, the vibrations (and forces) of the reaction frames 84A and 84B are transmitted to the floor FD via the base plate BP2, further, are damped by the vibration isolators 56A to 56C via the base plate BP1 and, after that, are transmitted to the barrel supporting bed 58. The transmitted vibrations (and forces) can become a vibration factor of the barrel supporting bed 58, further, projection optical system PL or laser interferometers 90× and 90Y as position detection units, which will be described later.

Then, according to the present embodiment, as shown in FIG. 2, a plurality of first damping members 85 for damping the vibration of the reaction frames 84A and 84B caused by the reaction force are fixed to the reaction frames 84A and 84B, in the consideration of the above points. Herein, as the first damping members 85, piezo-electric elements, for example, piezo-ceramic elements are used. In the following description, the first damping members 85 are called "piezo-electric elements 85" according to the necessity. Thus, the piezo-electric elements 85 damps the reaction forces (and forces) of the reaction frames 84A and 84B, and it is capable of damping the force transmitted to the base plate BP2 via the reaction frames 84A and 84B and the vibrations of the stators 82A and 82B caused by the vibrations of reaction frames 84A and 84B. Consequently, in the present embodiment, it is capable of improving positional controllability (including positioning performance) of the wafer stage WST and also of further suppressing an influence on each component of the stage supporting bed 16, the barrel supporting bed 58, the projection optical system PL, and the laser interferometers 90X and 90Y, etc. In this case, the piezo-electric elements 85 are attached at a position at which a maximum strain (maximum deflection) is caused by the vibrations of the reaction frames 84A and 84B. Because it is to effectively suppress the vibrations of the reaction frames 84A and 84B.

Herein, in order to further effectively damp the vibrations of the reaction frames 84A and 84B by using each of the piezo-electric elements 85, electrodes (counter electrodes) at both ends of the respective piezo-electric elements 85 can be connected to the ground (be earthed) via resistors, respectively. As a result, a mechanical stress acts on the piezo-electric elements 85 (such as a dielectric crystal) due to the vibrations of the reaction frames 84A and 84B, thereby electrically polarizing the piezo-electric elements 85 (piezo-electric effect). Therefore, a current flows through the resistors, thereby enabling s mechanical energy caused by the vibration to be actively transduced into a heat energy. Incidentally, if the resistor is not necessarily provided, the mechanical energy is finally transduced into the heat energy.

The wafer W is fixed onto the upper surface of the wafer stage WST via a wafer holder 88 by a vacuum chuck, etc. As shown in FIGS. 1 and 2, the XY-position of the wafer stage WST is measured in real time by using the laser interferometers 90X and 90Y for measuring change in positions of movable mirrors Ms1 and Ms2, which are fixed to a part of the wafer stage WST, with reference mirrors Mr1 and Mr2, as a reference, fixed to the lower end of the barrel of the projection optical system PL, with a predetermined resolution, e.g., a resolution of, approximately 0.5 to 1 nm. The measurement values of the laser interferometers 90X and 90Y are sent to the main controller 50 (refer to FIG. 3). Herein, at least one of the laser interferometers 90X and 90Y is a multi-axial interferometer having two or more measurement axes. Hence, the main controller 50 can obtain not only the XY-position but also θz rotational amount of the wafer stage WST, in addition thereto, the main controller 50 can obtain even the leveling amount of the wafer stage WST.

On the stage supporting bed 16, although omitted in FIG. 1 and FIG. 2, in actual, three vibration sensors (for example, accelerometers) are arranged to measure the vibration of the stage supporting bed 16 in the Z-direction. Another three vibration sensors (for example, accelerometers) (for example, of the three vibration sensors, the two measure the vibration of the stage supporting bed 16 in the Y-direction, and the remaining measures the vibration in the X-direction) are also arranged on the stage supporting bed 16 to measure a vibration in the XY-plane direction. In the following description, these six vibration sensors will be collectively referred to as the vibration sensor group 92 for the sake of convenience. The measurement values of the vibration sensor group 92 are sent to the main controller 50 (refer to FIG. 3). Accordingly, the main controller 50 can obtain the vibration of the stage supporting bed 16 based on the measurement values of the vibration sensor group 92 in directions of six degrees of freedom (X, Y, Z, θx, θy, and θz).

In addition, as explained above, the reticle stage used in the present embodiment employs what is called a counterweight method, as is disclosed in the Japanese Patent Laid Open No. 08-63231, and the corresponding U.S. application Ser. No. 09/260,544, which is referred to earlier. Therefore, if the friction between the reticle stage RST, the stators (212A and 212B), and the reticle base supporting bed 42 is null, the reaction force/offset load caused with the movement of the reticle stage RST should be theoretically also null. However, in actual, since the friction is not null and, since the line of action of the force or the like differs, the reaction force/offset load is not null.

Therefore, on the barrel supporting bed 58 which structures the main column 14, although omitted in FIG. 1 and FIG. 2, in actual, three vibration sensors (for example, accelerometers) are arranged to measure the vibration of the main column 14 in the Z-direction. Another three vibration sensors (for example, accelerometers) (for example, of the three vibration sensors, the two measure the vibration of the main column 14 in the Y-direction, and the remaining measures the vibration in the X-direction) are also arranged on the stage supporting bed 16 to measure the vibration in the XY-plane direction. In the following description, these six vibration sensors will be collectively referred to as the vibration sensor group 96 for the sake of convenience. The measurement values of the vibration sensor group 96 are sent to the main controller 50 (refer to FIG. 3). Accordingly, the main controller 50 can obtain the vibration of the main column 14 based on the measurement values of the vibration sensor group 96 in directions of six degrees of freedom.

In the present embodiment, since the stage supporting bed 16 and the barrel supporting bed 58 are respectively supported by the base plate BP2 and the base plate BP1 that are different from each other, as is described earlier, the positional relationship between the stage supporting bed 16 and the barrel supporting bed 58 needs to be confirmed.

Therefore, as is shown in FIG. 2, on the base plate BP1, a position sensor 98 which measures the position of the barrel supporting bed 58 with respect to the base plate BP1 via the target 97 fixed to the barrel supporting bed 58, and a position sensor 94 which measures the position of the stage supporting bed 16 with respect to the base plate BP1 via a target 93 fixed to the stage supporting bed 16, are arranged.

Figure 5:
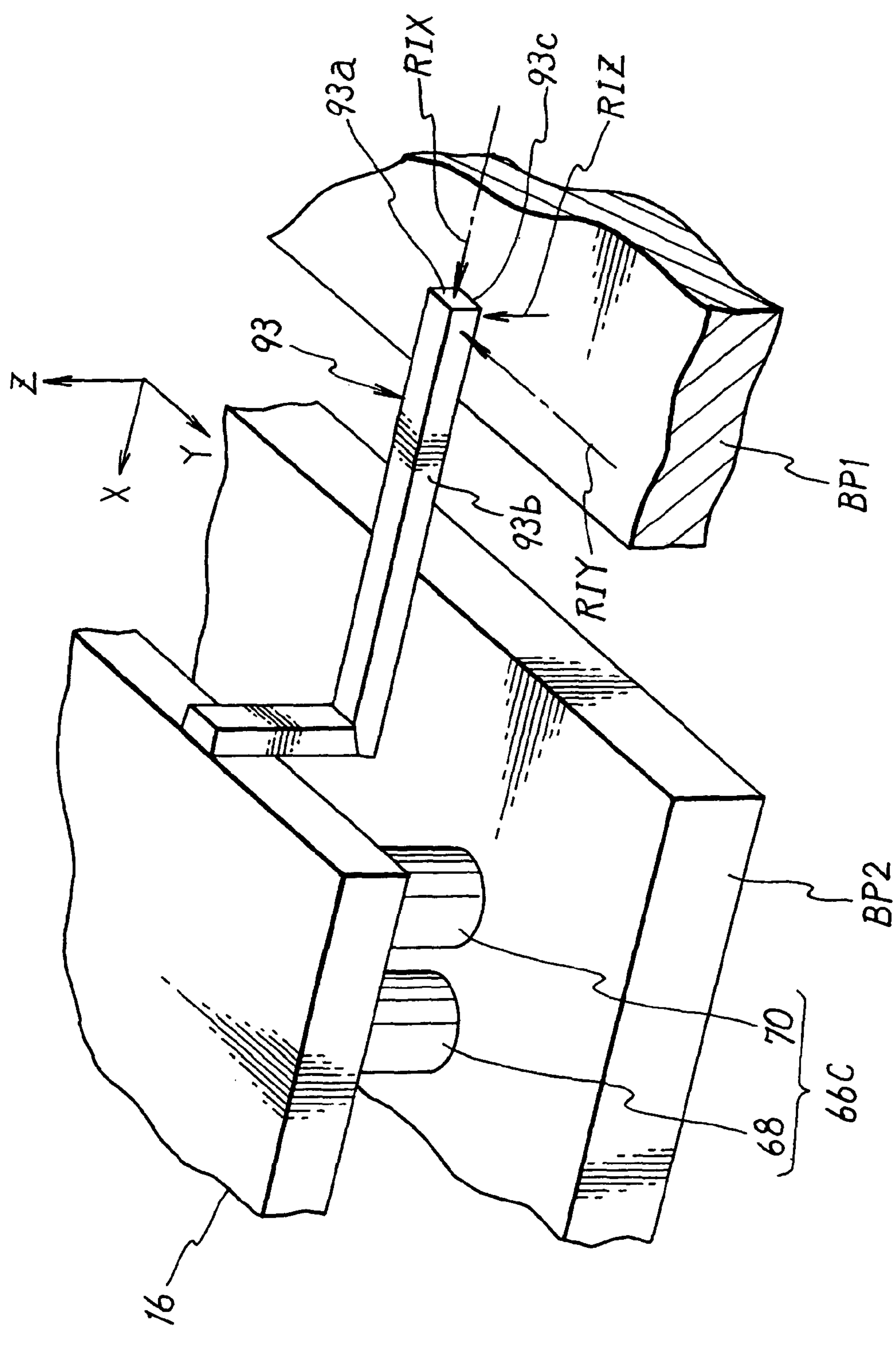
FIG. 5 is a view for illustrating the constitution of a position sensor for measuring a relative position between a base plate BP1 and a stage supporting bed 16 in FIG. 1.

As the target 93, for example, for example, as shown in FIG. 5, an L-shaped member which base end is fixed to the stage supporting bed 16, and has reflection surfaces 93*a*, 93*b*, and 93*c* being perpendicular to the X-, Y-, and Z-axes formed on the tip portion, is used. In this case, as the position sensor 94, a laser interferometer that irradiates measurement beams RIX, RIY, and RIZ respectively to the reflection surfaces 93*a*, 93*b*, and 93*c* can be used. In the present embodiment, by using multiple sets of such target 93 and laser interferometer 94, the Z-position, the X-position, and the Y-position of the stage supporting bed 16 are respectively measured at, at least, two points. However, hereinafter, for the sake of convenience, the position sensor 94 in FIG. 2 is to measure six relative positions, referred to above, between the base plate BP1 and the stage supporting bed 16. The measurement values of the position sensor 94 is to be sent to the main controller 50 (refer to FIG. 3).

The position sensor 98 is structured likewise with the position sensor 94, and the Z-position, the X-position, and the Y-position of the barrel supporting bed 58 are respectively measured at two points, with the base plate BP1 as a datum. However, hereinafter, for the sake of convenience, the position sensor 98 in FIG. 2 is to measure six relative positions, mentioned above, between the base plate BP1 and the barrel supporting bed 58. The measurement value of the position sensor 98 is also to be sent to the main controller 50 (refer to FIG. 3).

Accordingly, the main controller 50 can obtain the positional relationship between the base plate BP1 and the stage supporting bed 16 based on the measurement values of the position sensor 94 in directions of six degrees of freedom. And, the main controller 50 can also obtain the positional relationship between the base plate BP1 and the barrel supporting bed 58 based on the measurement values of the position sensor 98 in directions of six degrees of freedom.

In the present embodiment, as discussed above, the reaction force caused when the wafer stage WST is driven does not directly travel to the stage supporting bed 16, the reaction force may travel to the base plate BP2 through the reaction frames 84A and 84B. In this case, the piezo-electric elements 85 damp the reaction fore. Normally, the reaction force after damping is equal to an allowable level or less. However, when the wafer stage WST is increased in size and in acceleration and velocity, the influence exerted by the reaction force cannot be neglected. In such a case, there is a possibility that the reaction force after damping travels to the base plate BP2 and is further damped by the vibration isolators 66A to 66C, in addition, a slightly small amount of the reaction force is transmitted to the stage supporting bed 16, and this results in becoming a factor of the vibration, although it is excessively small.

Even in the above case, the main controller 50 controls the velocities of the vibration isolators 66A to 66C by feedback control, so that the vibration of the stage supporting bed 16 in directions of six degrees of freedom obtained by the measurement values of the vibration sensor group 92 is removed, and the vibration of the stage supporting bed 16 can be suppressed without fail. Also, the main controller 50 obtains the positional relationship between the base plate BP1 and the stage supporting bed 16 based on the measurement values of the position sensor 94 in directions of six degrees of freedom, and based on this information on the positional relationship, the main controller 50 controls the vibration isolators 66A to 66C so that the stage supporting bed 16 can be maintained at a stable position at all times with the base plate BP1 as a reference.

In addition, the main controller 50 can for example, control the velocities of the vibration isolators 56A to 56C by feedback control or feed-forward control, so that the vibration of the main column 14 which may occur with the movement of the reticle stage RST, and the like, in directions of six degrees of freedom obtained by the measurement values of the vibration sensor group 96 is removed, and the vibration of the main column 14 can be effectively suppressed. The main controller 50 also obtains the positional relationship of the main column 14 in respect to the base plate BP1, in directions of six degrees of freedom based on the measurement values of the position sensor 98. By using this information on the positional relationship, the main controller 50 controls the vibration isolators 56A to 56C so that the barrel supporting bed 58 can be maintained at a stable position at all times with the base plate BP1 as a datum.

Furthermore, in the present embodiment, as shown in FIG. 2, three laser interferometers 102 are fixed on three different positions on the flange FLG of the projection optical system PL (however, only one of these interferometers is shown in FIG. 2.).

With the barrel supporting bed 58, on three areas facing these laser interferometers 102, an openings 58*b* is respectively formed. And, through these openings 58*b*, a measurement beam is repeatedly irradiated in the Z-axis direction toward the stage supporting bed 16 from the laser interferometers 102. In a position for each measurement beam, on the upper surface of the stage supporting bed 16 facing position of the measurement beams, a reflection surfaces is respectively formed. Therefore, by the three laser interferometers 102, the Z-position of the stage supporting bed 16 is measured, respectively, at three different points with the flange FLG as a reference. Incidentally, in FIG. 2, since it shows the state where the center of the shot area of the wafer W on the wafer stage WST exists just below the optical axis AX of the projection optical system PL, the measurement beams are cut off by the wafer stage WST. Then, interferometers which measure the Z-positions of the wafer stage WST three different points on the reflection surfaces that are formed on the upper surface of the wafer stage WST with the projection optical system PL or the flange FLG as a reference may be attatched.

The measurement values of the laser interferometers 102 are also sent to the main controller 50 (refer to FIG. 3). The main controller 50 can, for example, obtain the positional relationship between the projection optical system PL and the stage supporting bed 16 in directions of three degrees of freedom (Z, θx, and θy), which are the direction of the optical axis AX of the projection optical system PL and in the tilt direction in respect to the plane perpendicular to the optical axis.

Referring back to FIG. 1, on the base plate BP1, a reticle loader 110 is arranged to load and unload the reticle R onto and from the reticle stage RST. A wafer loader 112 is also arranged on the base plate BP1 to load and unload the wafer W onto and from the wafer stage WST. The main controller 50 controls both the reticle loader 110 and the wafer loader 112 (refer to FIG. 3).

The main controller 50, for example, when reticles are exchanged, controls the reticle loader 110 based on the measurement value of the reticle laser interferometer 46 *e* that it can keep the position of the reticle stage RST staying all the time with the base plate BP1 as a reference, during carriage. Consequently, the reticle R can be loaded to the desired position on the reticle stage RST.

Similarly, when wafers are exchanged, the main controller 50 controls the wafer loader 112 based on the measurement values of the laser interferometers 90X and 90Y, and the measurement values of the position sensor 94 so that it can keep the position of the wafer stage WST staying all the time with the base plate BP1 as a reference. Consequently, the wafer W can be loaded to the desired position on the wafer stage WST.

The illumination system housing 26A of the first partial illumination optical system IOP1 is supported by a supporting column 118 that is placed onto a vibration isolator bed 116 supported in three points by a third base plate BP3 which is placed to the floor surface FD independently of the first and second base plates BP1 and BP2. As the vibration isolator bed 116, likewise in the vibration isolators 56A to 56C and 66A to 66C, an active vibration isolation bed is used, which comprises air mounts, voice coil motors (actuators) and vibration detection sensors (for example, accelerometers) attached to the supporting column 118. The vibration travelling from the floor surface FD is isolated to be at a micro-G level by the active vibration isolator bed 116.

Furthermore, in the present embodiment, the apparatus comprises a base interferometer 120 (refer to FIG. 3) which measures the positional relationship between the second partial illumination optical system IOP2 and the reticle base supporting bed 42 in directions of six degrees of freedom.

To be more specific, as shown in FIG. 4, on the upper surface of the reticle base supporting bed 42, a pair of targets 230A and 230B which are composed of the same L-shaped member as of the target 93 mentioned above are fixed facing the illumination system housing 26B of the second partial illumination optical system IOP2. Also, onto the illumination system housing 26B, a total of six laser interferometers (not shown in FIG. 4) to measure the positions of the targets 230A and 230B in each of the X-, Y-, and Z-directions are fixed. These six laser interferometers make up the base interferometer 120 shown in FIG. 3. The six measurement values from the base interferometer 120, that is, positional information (deviation information) of the two points in the X-, Y-, and Z-directions, are sent to the main controller 50. The main controller 50 can obtain the positional relationship between the second partial illumination optical system IOP2 and the reticle base supporting bed 42 in directions of six degrees of freedom (in the X, Y, Z, θx, θy, and θZ-directions) based on the six measurement values of the base interferometer 120.

Hence, the main controller 50 finely adjusts the positional relationship between the second partial illumination optical system IOP2 and the reticle R in directions of six degrees of freedom, by adjusting the position of the reticle stage RST (reticle fine movement stage 208) within the XY-plane via the driver 44 and controlling the vibration isolator 56A to 56C, based on the positional relationship obtained earlier in directions of six degrees of freedom from the measurement values of the base interferometer 120.

In addition, the main controller 50 can control the vibration isolators 56A to 56C based on the measurement values of the vibration sensor group 96 so as to suppress the rough vibration of the main column 14, and can also control the position of the reticle stage RST (reticle fine movement stage 208) based on the measurement values of the base interferometer 120 so as to effectively suppress the subtle vibration of the main column 14.

FIG. 3 briefly shows the control system of the exposure apparatus 10 described above. In this control system, the main controller 50, being a workstation (or a microcomputer), plays the central role. Beside performing the various controls that has been described so far, the main controller 50 controls the apparatus as a whole.

Next, the exposure operations of the exposure apparatus 10 having the above arrangement will be described.

As a premise, various conditions are set beforehand so that the shot areas on the wafer W are scanned and exposed by a suitable exposure amount (target exposure amount). In addition, preparatory operations such as reticle alignment and baseline measurement using the reticle microscope and the off-axis alignment sensor (both not shown in Figs.) are performed, and after the preparatory operations above have been completed, fine alignment (such as EGA (enhanced global alignment)) of the wafer W using the alignment sensors is performed. Then, the arrangement coordinates of the plurality of shot areas on the wafer W are obtained.

When all of the preparatory operations have been completed to perform exposure on the wafer W, the main controller 50 then moves the wafer stage WST to the scanning starting position for the first shot exposure of the wafer W based on the alignment results, by controlling the driver 72 while monitoring the measurement values of the laser interferometers 90X and 90Y.

Then, the main controller 50 begins to scan the reticle stage RST and wafer stage WST via the drivers 44 and 72, and when the stages RST and WST reach the target scanning velocities respectively, by the ultraviolet pulse light state to irradiate the pattern area of the reticle R and scanning exposure begins.

The light source 12 starts to emit the ultraviolet pulse light prior to the start of scanning exposure, however, since the movement of each blade of the movable blind structuring the reticle blind mechanism 28M is controlled in sync with the movement of the reticle stage RST by the main controller 50, the ultraviolet pulse light is prevented from irradiating the area other than the pattern area of the reticle R, likewise with the scanning steppers.

The main controller 50 synchronously controls the reticle stage RST and the wafer stage WST via the driver 44 and the driver 72, particularly during the scanning exposure described above, so that the velocity ratio of the movement velocity Vr of the reticle stage RST in the Y-axis direction and the movement velocity Vw of the wafer stage WST in the Y-axis direction is maintained to correspond to the projection magnification (1/5 or 1/4) of the projection optical system PL.

When different areas on the pattern area of the reticle R are sequentially illuminated by the ultraviolet pulse light and the entire pattern area has been illuminated, the scanning exposure of the first shot area on the wafer W is completed. In this manner, the pattern of the reticle R is reduced and transferred onto the first shot area via the projection optical system PL.

After completing the scanning exposure on the first shot area in this manner, the main controller then moves the wafer stage WST by steps via the driver 72 in the X- and Y-axis directions, and moves the wafer stage WST to the scanning starting position of the second shot area. When this stepping operation is performed, the main controller 50 measures the positional deviation of the wafer stage WST in directions X, Y, and θz in real time based on the measurement values of the laser interferometers 90X and 90Y serving as position detection units for detecting the position of the wafer stage WST (position of the wafer W). Based on the measurement results, the main controller 50 controls the driver 72 so that the XY-positional displacement of the wafer stage WST is at a predetermined state, thus controls the position of the wafer stage WST.

The main controller 50 controls the driver 44 based on the information on displacement in the θZ-direction of the wafer stage WST, and to compensate for an error in rotational deviation on the wafer W side, the reticle stage RST (reticle fine movement stage 208) is rotatably controlled.

The main controller 50 performs scanning exposure on the second shot, likewise as is described above.

In this manner, scanning exposure of the shot area on the wafer W and stepping operations to expose the next shot area are repeatedly performed, and the pattern of the reticle R is sequentially transferred onto the entire shot area subject to exposure on the wafer W.

Although it is not specifically described above, as is with the recent scanning steppers, while scanning exposure is being performed on each shot area on the wafer W, the main controller 50 performs exposure based on the measurement values of a focus detection system (not shown) with the image being in focus with the depth of focus under several hundred nm.

However, with the device rule becoming finer these days, it is becoming difficult to precisely secure the uniformity of the line width of a pattern image transferred onto the wafer W with only the focus control of the wafer W during scanning exposure. This is because when the pattern is transferred onto a shot area located in the circumference of the wafer, the line width area of the pattern image varies from a side where there is no adjacent shot area to a side where there is an adjacent shot area due to the difference of flare effect. To avoid or suppress such inconvenience, it is preferable to perform a dummy exposure on a virtual shot area further outside shot areas on the circumference of the wafer.

Therefore, in the present embodiment, when the dummy exposure is performed, focus leveling control on the wafer stage WST is performed by obtaining the positional relationship between the projection optical system PL and the stage supporting bed 16 in directions of three degrees of freedom (Z, θx, and θy), which are the direction of the optical axis AX of the projection optical system PL and in the tilt direction with respect to the plane perpendicular to the optical axis based on the measurement values of the laser interferometer 102 mentioned above, and by controlling the vibration isolators 66A to 66C, and the like. Accordingly, even when dummy exposure is performed, focus control with high precision is possible, and as a consequence, controllability of the line width can also be improved.

As described in detail, in the exposure apparatus 10 in the present embodiment, the vibration isolators 56A to 56C for supporting the main column 14 are arranged on the base plate BP1, and the vibration isolators 66A to 66C for supporting the stage supporting bed 16 are arranged independently of the base plate BP1, on the base plate BP2 which is arranged on the floor surface FD. Therefore, between the base plate BP1 and the base plate BP2, no direct vibration is transmitted and only a vibration is transmitted through the floor surface FD. As a consequence, the reaction force caused with the movement (driving) of the wafer stage WST supported on the stage supporting bed 16 directly does not travel to the base plate BP1. The reaction force caused on acceleration and deceleration of the wafer stage WST is transmitted to the base plate BP2 via the reaction fames 84A and 84B, and the reaction force in this case is damped by the piezo-electric elements 85. Therefore, the reaction force caused upon the acceleration and deceleration of the wafer stage WST to be transmitted to the base plate BP2 is a remarkably small force. If this force is transmitted to the base plate BP1 via the floor surface FD, there is no possibility that large variation which is measurable is caused in the projection optical system PL supported to the main column 14 which is provided onto the base plate BP1. Hence, since it is possible to reduce the influence that is exerted on each component in the apparatus by the reaction force caused upon the acceleration and deceleration, as much as possible, the wafer stage is increased in size and in acceleration and velocity. The piezo-electric elements 85 damp the vibration of the reaction frames 84A and 84B, thus also improving positional controllability of the wafer stage WST.

Since the active vibration isolator bed is adopted as the vibration isolators 56A to 56C, and the main F controller 50 controls the vibration isolators 56A to 56C based on the measurement values of the position sensor 98 which measures the positional relationship between the base plate BP1 and the main column 14, the main column 14, and naturally the projection optical system PL supported by the main column 14 can be maintained at a stable position with the base plate BP1 as a datum. Also, the reticle stage RST is arranged on the main column 14, however since the stage employed as the reticle stage RST is based on a counter-weight method, the vibration of the main column 14 caused by the reaction force due to the movement of the reticle stage RST is extremely small. Even this extremely small vibration of the main column 14 can be suppressed or removed by the vibration isolators 56A to 56C for supporting the main column 14.

Furthermore, since the active vibration isolator bed is adopted as the vibration isolators 66A to 66C, and the main controller 50 controls the vibration isolators 66A to 66C based on the measurement values of the position sensor 94 which measures the positional relationship between the base plate BP1 and the stage supporting bed 16, the stage supporting bed 16 can be maintained at a stable position with the base plate BP1 as a datum. The vibration of the stage supporting bed 16 caused by the movement of the wafer stage WST can be suppressed or removed by the vibration isolators 66A to 66C.

Accordingly, in the present embodiment, the positional shift of the pattern to be transferred, the image blur, etc. caused by the vibration of the projection optical system PL can be effectively suppressed, and the exposure accuracy can be improved.

In addition, by the various methods devised as described above, a vibration and a stress affecting each component of the apparatus are reduced, and the positional relationship between each component of the apparatus can be maintained and adjusted with higher precision. This allows the wafer stage WST to increase in size and in acceleration and velocity, and provides an advantage of being able to improve throughput.

Incidentally, in the above embodiment, the case is described where the main controller 50 controls all the vibration isolators, the vibration isolator bed, the reticle loader, and the wafer loader. The present invention, however, is not limited to this, and separate controllers may be arranged respectively to control each of these units. Or, several units may be combined into groups, and a multiple of controllers may control these groups.

In the above embodiment, the case is described where the active vibration isolator bed is employed for all of the vibration isolators and the vibration isolator bed, however, as a matter of course, the present invention is not limited to this. That is, all of the vibration isolators, one of the vibration isolator, or a plurality of vibration isolators may be a passive vibration isolator bed.

Second Embodiment

Figure 6:
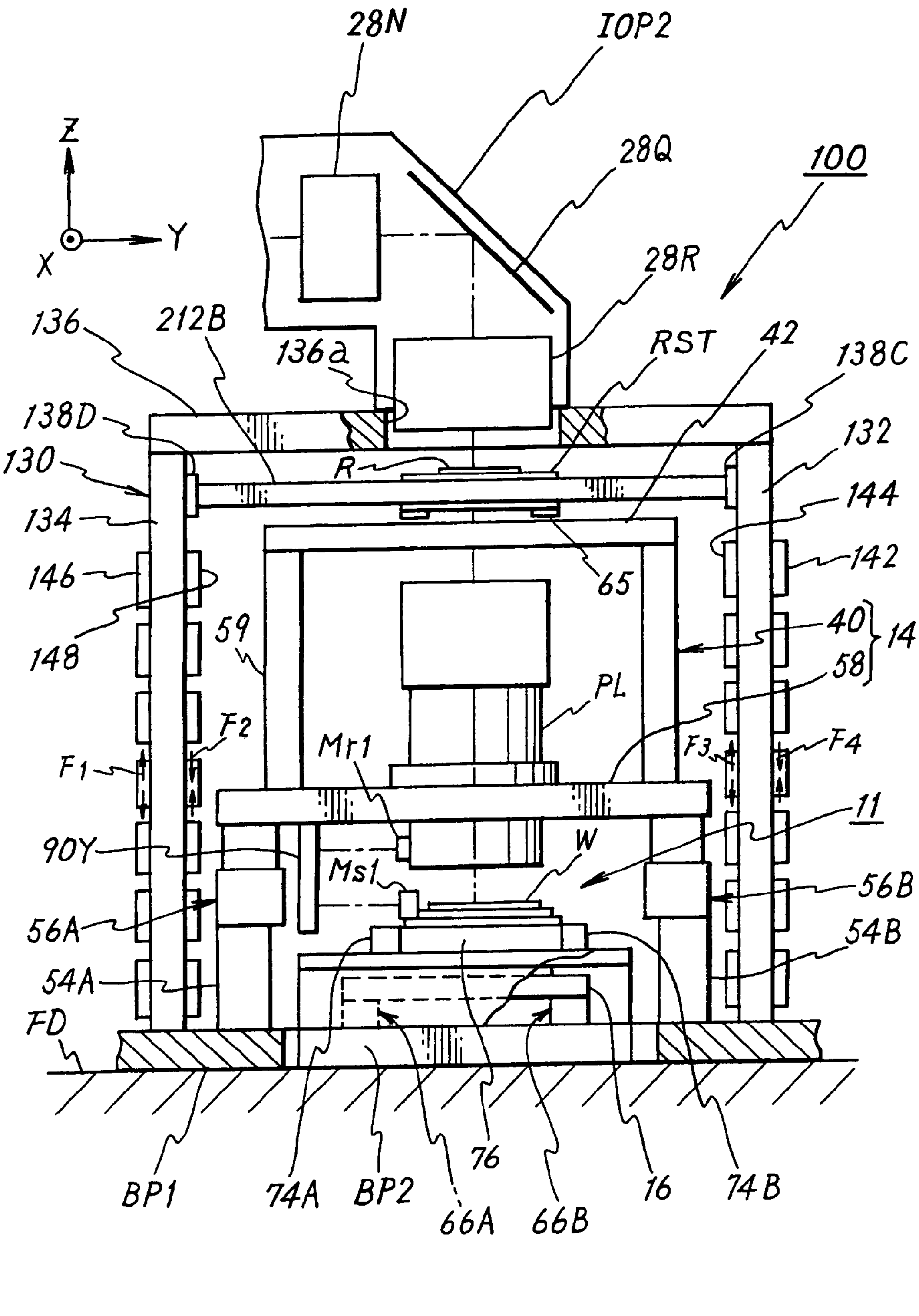
FIG. 6 is a view schematically showing the constitution of a main portion of an exposure apparatus according to the second embodiment of the present invention.
Figure 7:
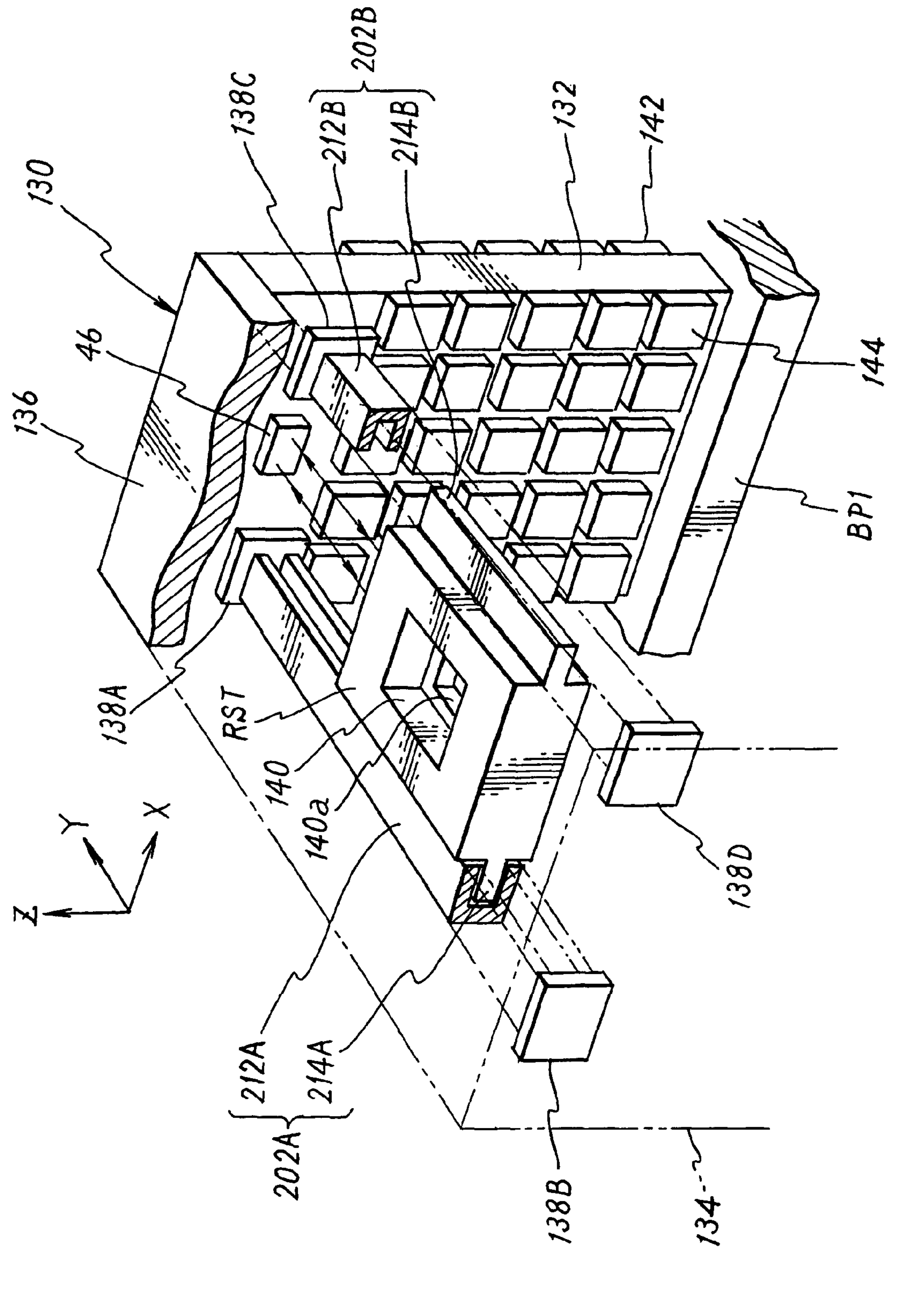
FIG. 7 is a perspective view schematically showing a driving mechanism of a reticle stage and a frame supporting the driving mechanism in FIG. 6.
Figure 8:
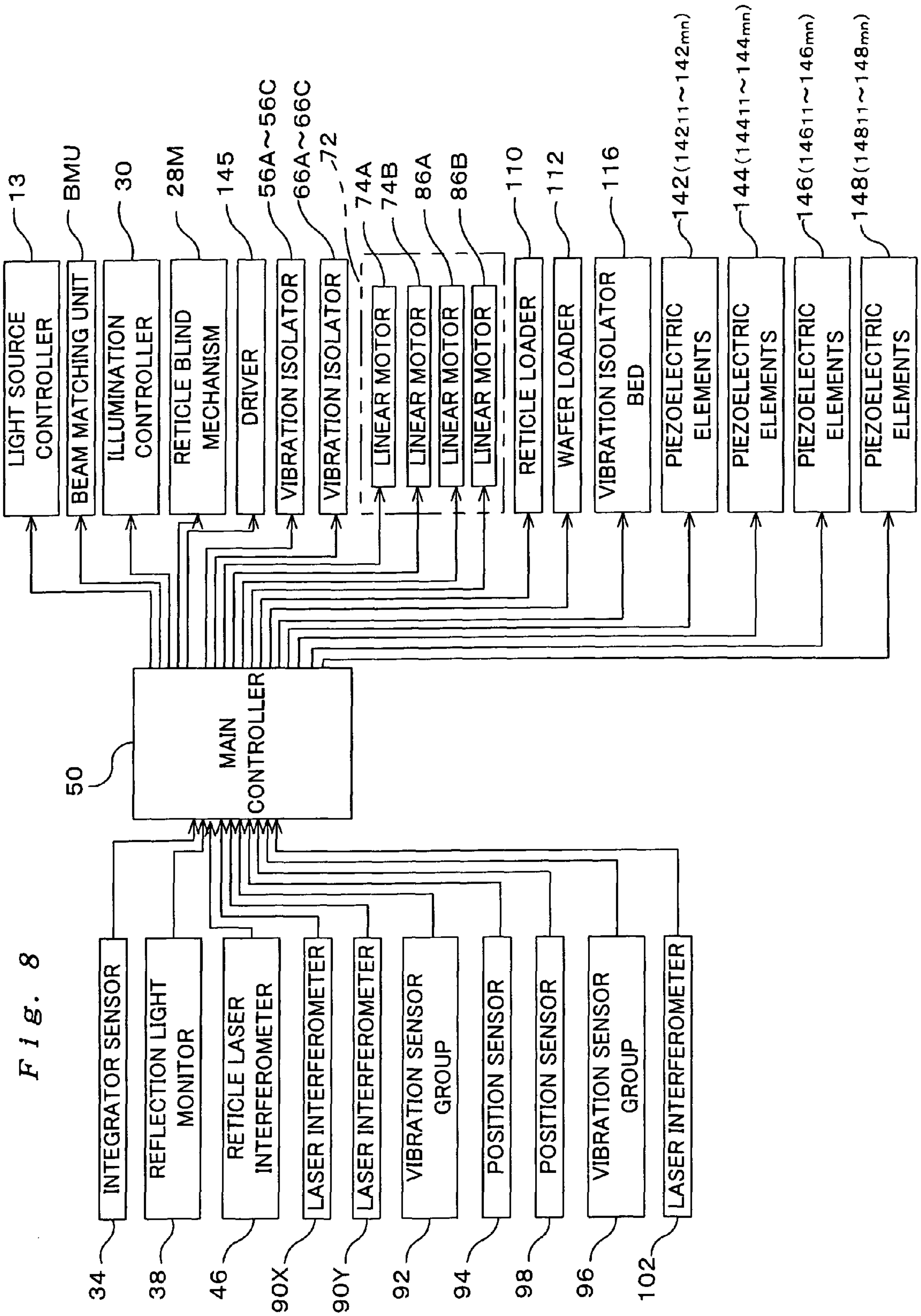
FIG. 8 is a block diagram schematically showing the constitution of a control system in the apparatus in FIG. 6.

Next a description is given of the second embodiment of the present invention with reference to FIGS. 6 to 8. Herein, the same reference numerals denote the same or equivalent to components of the above first embodiment, and the description is brief or is omitted.

FIG. 6 schematically shows the constitution of the main portion of an exposure apparatus 100 according to the second embodiment. In a manner alike to the exposure apparatus 10 according to the first embodiment, the exposure apparatus 100 is a reduction projection exposure apparatus based on the step-and-scan method, that is, a so-called scanning stepper, which transfers the pattern of the reticle R as a mask onto the wafer W as a substrate.

In the exposure apparatus 100, the constitutions of the reticle stage RST and the driving mechanism, etc. and the constitution of the main column 14 as a holding portion differ much from those in the aforementioned exposure apparatus 10. Therefore, the different points will be mainly described in the following.

The main column 14 consists of: the barrel supporting bed 58 which is supported almost horizontally via three struts 54A to 54C (the strut 54A in the depth of FIG. 6 is not shown, refer to FIG. 2) arranged on the first base plate BP1 serving as the datum of the apparatus set horizontally on the floor surface FD and via the vibration isolators 56A to 56C (the vibration isolator 56C in the depth of FIG. 6 is not shown, refer to FIG. 2) fixed on upper positions of the struts 54A to 54C; and the supporting column 40 which stands on the barrel supporting bed 58. Among these components, the supporting column 40 comprises: four props 59 that are horizontally implanted onto the upper surface of the barrel supporting bed 85; and a reticle base supporting bed 42 which is horizontally held by the props 59.

A plurality of air bearings (air pads) 65 serving as non-contact bearings are fixed to the bottom of the reticle base stage RST. The reticle stage RST is supported above the reticle base supporting bed 42 by air-levitation with the air-pads 65. The reticle stage RST is driven by a driver 145 (not shown in FIG. 6, refer to FIG. 8) serving as a mask driving mechanism in the Y-axis direction as a scanning direction within a predetermined stroke range. Incidentally, the reticle driver 145 will be described later.

A reticle fine movement stage not shown in the drawings is arranged on the reticle stage RST to finely drive the reticle R in a non-scanning direction (in the X-direction) while chucking and holding the reticle R. However, driving operation of the reticle R in the non-scanning direction is almost never concerned with the present invention and, therefore, a description of a driving system in the non-scanning direction is omitted in the following.

Herein, a specific structure of the driver 145, etc. will be explained with reference to FIG. 7. As shown in the perspective view of FIG. 7, movers 214A and 214B, which contain coils and extend in the Y-direction, are integrally arranged respectively in the almost center portions in the Z-direction of both side surfaces in the X-direction of the reticle stage RST. A pair of stators 212A and 212B having U-shaped sectional surfaces are disposed, facing the movers 214A and 214B, respectively. The stators 214A and 214B comprise stator yokes and a large number of permanent magnets which are arranged along extending directions of the stator yokes at a predetermined interval and generate an alternating field. That is, in the present embodiment, the mover 214A and the stator 212A constitute a linear motor 202A of a moving-coil type, and the mover 214B and the stator 212B constitute a linear motor 202B of the moving-coil type. The aforementioned driver 145 comprises a pair of the linear motors 202A and 202B and a driving system of a fine movement stage not shown in the figure. The main controller 50 (refer to FIG. 8) controls the driver 145 serving as a mask driving mechanism including the linear motors 202A and 202B.

As shown in FIG. 6 and FIG. 7, the stators 212A and 212B are horizontally supported by a portal frame 130, setting the longitudinal directions of the stators 212A and 212B to be the Y-direction.

Specifically speaking, the frame 130 comprises: first and second vertical members 132 and 134 which are arranged along the XZ-plane to be opposed each other and also are disposed on the first base plate BP1; and a horizontal plate

136 through which upper end portions of the first and second vertical members 132 and 134 are mutually coupled. One end and the other end of the one stator 212A in the longitudinal direction are fixedly supported to inner walls of the first and second vertical members 132 and 134 through rectangular-plate-shaped mounting members 138A and 138B, respectively. Also, one end and the other end of the other stator 212B in the longitudinal direction are fixedly supported to inner walls of the first and second vertical members 132 and 134 through rectangular-plate-shaped mounting members 138C and 138D, respectively.

An opening 136*a* is formed almost in the center portion of the horizontal plate 136. An emission end portion of the second partial illumination optical system IOP2 is supported from the lower side by the horizontal plate 136 in a state in which the edge of the main condenser lens system 28R is inserted in the opening 136*a*. It is noted that the other side of the second partial illumination optical system IOP2 is supported by the horizontal plate 136 via a supporting member (not shown). In the present second embodiment, differently from the first embodiment, a base interferometer is not arranged (refer to FIG. 8).

As shown in FIG. 7, a concave portion 140 having a rectangular-shaped sectional surface is formed on the upper surface of the reticle stage RST. A rectangular opening 140*a* is formed in the center of the bottom inside the concave portion 140. And, the reticle R is set in the concave portion 140 so that the opening 140*a* is covered, and FIG. 6 shows a state in which the reticle R is set onto the upper surface of the reticle state RST for the sake of the convenience on illustration.

A pair of corner cubes (not shown) are arranged on the side surface of the reticle stage RST in the (+Y)-direction. The Y-position of the reticle stage RST is measured by a reticle laser interferometer (hereinlater, abbreviated to "reticle interferometer") through the pair of corner cubes with a predetermined resolution, e.g., approximately 0.5 to 1 nm. The reticle interferometer 46 is fixed onto the supporting column 40 in FIG. 6. Although a reference mirror (fixed mirror) of the reticle interferometer 46 is not shown in Fig., it is fixed to the barrel of the projection optical system PL. A measurement value of the reticle interferometer 46 is supplied to the main controller 50 (refer to FIG. 8).

As shown in FIG. 7, fixed to the outer surface and the inner surface of the first vertical member 132 constituting the frame 130 with arrangement of a matrix having m rows and n columns, are piezoelectric elements 142 (142$_{11}$ to 142$_{mn}$) and piezoelectric elements 144 (144$_{11}$ to 144$_{mn}$) such as piezo ceramic elements, etc., serving as 4 damping members (refer to FIG. 8). The piezoelectric elements 142 and the piezoelectric elements 144 (where, i=1 to m, and j=1 to n) are disposed at mutually opposed positions.

Likewise, fixed to the outer surface and the inner surface of the second vertical member 134 with arrangement of a matrix having m rows and n columns, are piezoelectric elements 146 (146$_{11}$ to 146$_{mn}$) and piezoelectric elements 144 (148$_{11}$ to 148$_{mn}$) such as piezo ceramic elements, etc., serving as damping members (refer to FIG. 8). The piezoelectric elements 146 and the piezoelectric elements 148 (where, i=1 to m, j=1 to n) are disposed at mutually opposed positions.

In the present embodiment, as shown in FIG. 8, the piezoelectric elements 142, 144, 146, and 148 are connected to the main controller 50. The main controller 50 controls the respective piezoelectric elements in accordance with the reaction force caused by driving the reticle stage RST, so that a force to cancel vibrations of the first and second vertical members 132 and 134 is produced in the respective piezoelectric elements. In this case, differently from the first embodiment, the piezoelectric elements are mainly used as electro-mechanical transducers which generate mechanical strains by applying an electric energy. In other words, by employing an effect that a voltage is impressed to both ends (across electrodes) of the piezoelectric elements (crystal) and, then, a mechanical strain is caused, serving as an inverse effect of the above-described piezoelectric effect (this is also referred to as the piezoelectric effect), as represented by a tensile force $F_1$ and a compressive force $F_2$ and a tensile force $F_3$ and a compressive force $F_4$, voltages are applied to the piezoelectric element 142$_{ij}$ and piezoelectric element 144$_{ij}$ and the piezoelectric element 146$_{ij}$ and piezoelectric element 148$_{ij}$, respectively, to cause set forces to generate deflection deformations in the first vertical member 132 and the second vertical member 134. That is, in the present second embodiment, the main controller 50 constructs the controller which controls the individual piezoelectric elements (electro-mechanical transducers) in accordance with the reaction force caused by driving the reticle stage RST.

In this case, the main controller 50 may control a voltage applied to the respective piezoelectric elements by feed-forward based on, for instance, an instructing value (instructing value of a reticle-stage drive force) of a thrust force to the reticle stage RST. By utilizing the feed-forward control, prior to practical occurrence of the deflection force in the first and second vertical members 132 and 134 (hereinlater, referred to as "deformation A" for the sake of convenience) due to the vibration, a deflection force to cancel the aforementioned deflection force (hereinlater, referred to as "deformation B" for the sake of convenience) can be caused. Therefore, when the reaction force caused by the driving the reticle stage RST is transmitted to the first vertical member 132 and the second vertical member 134 via the stators 212A and 212B, the deformation A caused in the first and second vertical members 132 and 134 and the deformation B due to the vibration of the first and second vertical members 132 and 134 which is caused by the above transmitted reaction force are synthesized. As a consequence, the occurrence itself of the vibrations of the first vertical member 132 and the second vertical member 134 is actively suppressed (deformation A+deformation B @ 0)

FIG. 8 shows a main portion of a control system of the exposure apparatus 100. The control system is structured mainly by the main controller 50, similarly to the control system in FIG. 3. Except for that the base interferometer is not connected to an input end of the main controller 50 and the piezoelectric elements 142 to 148 are connected, the constitution is similar to that of the control system in FIG. 3.

Also, other portions constituting the apparatus are the same as those of the above-mentioned first exposure apparatus 10.

By the exposure apparatus 100 constituted as mentioned above according to the present second embodiment, it is possible to obtain advantages equivalent to those of the above-explained first embodiment. Further, it is also possible to actively suppress the occurrence itself of the vibration of the frame 130 (specifically, the first vertical member 132 and the second vertical member 134) to which the reaction force caused by the driving the reticle stage RST is transmitted.

Note that the above second embodiment exemplifies the case of utilizing the piezoelectric elements which are one type of electromechanical transducers as damping members.

However, the present invention is not limited to the case and it is possible to utilize a magnetostriction element, which is an element for transducing an electric vibration to a mechanical vibration by use of magnetostriction characteristics, and other electro-mechanical transducers as damping members.

Incidentally, in a manner alike to that in the description of the above second embodiment, a plurality of electro-mechanical transducers (piezoelectric elements) can also be fixed to the reaction frames 84A and 84B on the wafer stage WST side, and the main controller 50 can control the voltage applied to the piezoelectric elements in accordance with the reaction force caused by the driving the wafer stage WST. In this case, it is possible to actively suppress the occurrence itself of the vibration of the reaction frames 84A and 84B to which the reaction force caused by the driving the wafer stage WST is transmitted. Hence, the vibration (and force) transmitted to the base plate BP2 can be further decreased.

Also, in the above-discussed second embodiment, obviously, the piezoelectric elements 142, 144, 146, and 148 may be employed by the same method as a method using the piezoelectric elements 85 in the aforementioned first embodiment for the main purpose of damping of the vibration of the frame 130 (first and second vertical members 132 and 134), without connecting the piezoelectric elements 142, 144, 146, and 148 to the main controller 50.

It is noted that the above first and second embodiments exemplify the case wherein the wafer stage WST is a single two-dimensional movement stage and the stators of the liner motors, which drive the wafer stage WST in the scanning direction, are arranged on the reaction frames and, however, of course, the present invention is not limited thereto.

That is, as will be subsequently described in the third embodiment, the wafer stage WST can be, for example, an XY-stage of a two-stage structure having a Y-stage which moves in the Y-direction and an X-stage which moves on the Y-stage in the X-direction while holding the wafer. The stage base (stage supporting bed) for movably supporting the wafer stage WST can also be supported by the reaction frames independently of the main column with respect to the vibration.

Third Embodiment

Figure 9:
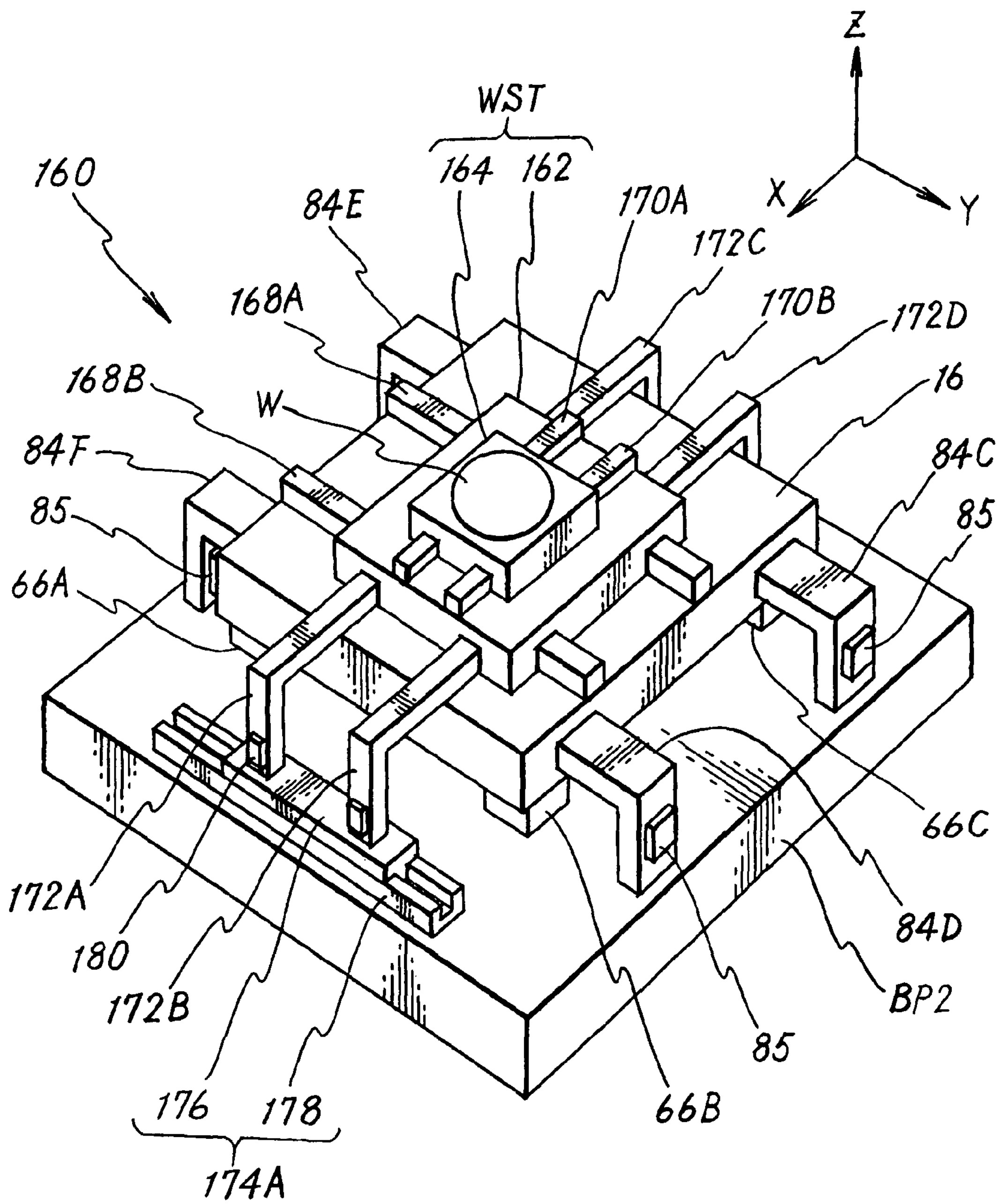
FIG. 9 is a perspective view schematically showing the structure of a stage unit constituting an exposure apparatus according to the third embodiment of the present invention.
Figure 10:
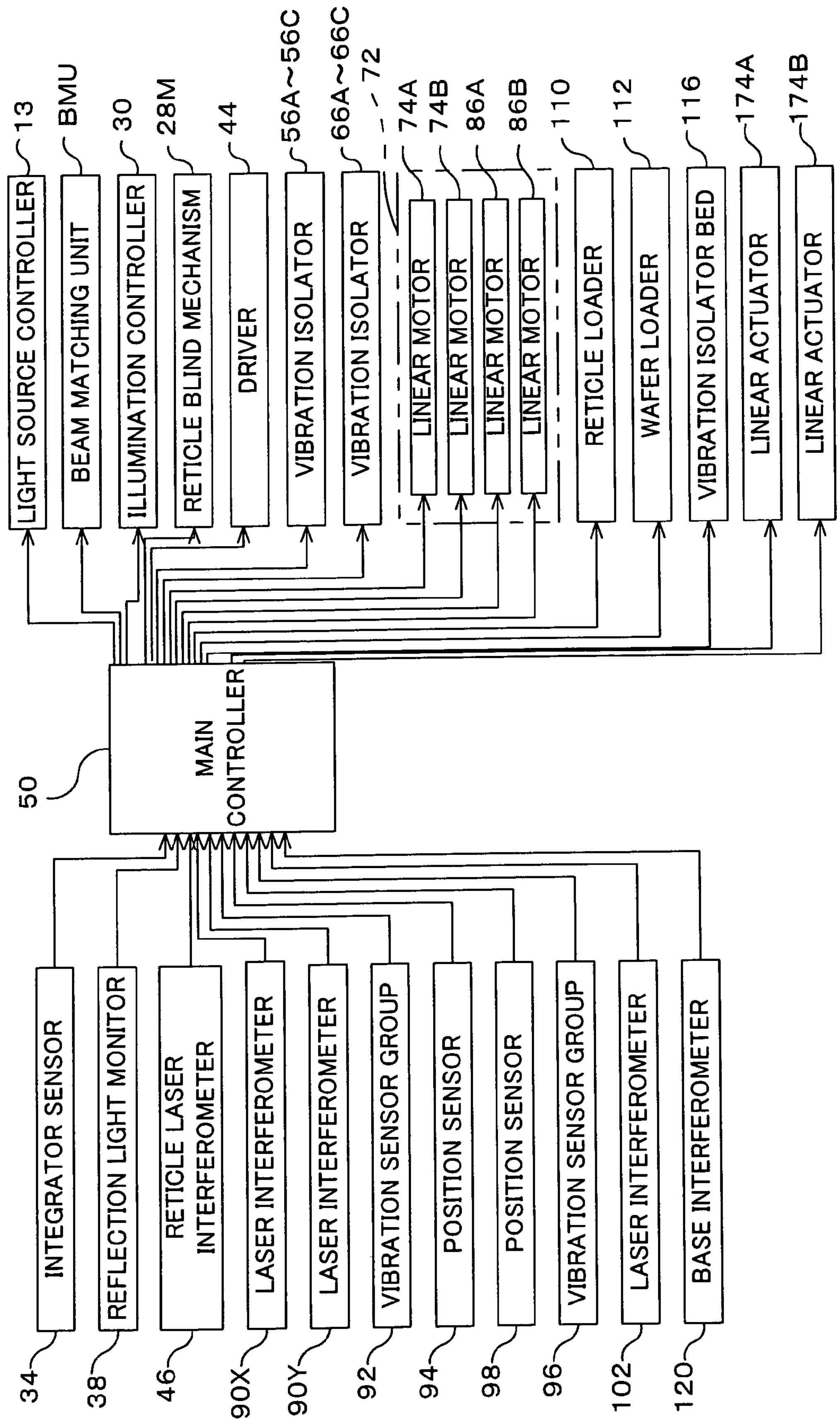
FIG. 10 is a block diagram schematically showing the constitution of a control system of the exposure apparatus according to the third embodiment.

Next, a description is given of the third embodiment of the present invention with reference to FIGS. 9 and 10. An exposure apparatus of the present third embodiment differs from the exposure apparatus of the above first embodiment, only in the stage unit which holds the wafer W. Therefore, the stage unit is mainly described in the following. It is noted that the same reference numerals are used for components similar or equivalent to those of the first embodiment.

FIG. 9 shows a perspective view of a stage unit 160 constituting the exposure apparatus according to the third embodiment. The stage unit 160 comprises: the stage supporting bed 16, serving as a stage base, which is horizontally arranged above the second base plate BP2 in FIG. 1 and is held by reaction frames 84C, 84D, 84E, and 84F as first transmitting members consisting of L-shaped members; a Y-stage 162, serving as a first stage, which is disposed onto the upper surface of the stage supporting bed 16; an X-stage 164, serving as a second stage, which is disposed onto the Y-stage 162. The wafer W serving as a substrate (and a sample) is fixed onto an upper surface of the X-stage 164 via a wafer holder not shown in the figures by vacuum chuck, etc.

The above-explained vibration isolators 66A to 66C are arranged between the above stage supporting bed 16 and the second base plate BP2.

Individual one ends of the reaction frames 84C and 84D and the reaction frames 84E and 84F are securely fixed to side surfaces on one side and the other side of the stage supporting bed 16 in the Y-direction. Individual other ends of the reaction frames 84C and 84D and the reaction frames 84E and 84F are fixed onto an upper surface of the second base plate BP2 with screw cramp. The piezoelectric elements 85, serving as first damping members, are fixed to the respective reaction frames 84C, 84D, 84E, and 84F. Also, in this case, the piezoelectric elements 85 are fixed at positions to cause maximum deflections of the reaction frames 84C, 84D, 84E, and 84F, respectively.

A pair of Y-guides 168A and 168B extending in the Y-direction is fixed onto the upper surface of the stage supporting bed 16. Arranged between the stage supporting bed 16 and the Y-stage 162, are linear motors 86A and 86B (not shown in FIG. 9, refer to FIG. 10) for driving the Y-stage 162 along the Y-guides 168A and 168B in the Y-axis direction as the scanning direction.

Likewise, a pair of X-guides 170A and 170B extending in the X-direction is fixed onto the upper surface of the Y-stage 162. Arranged between the Y-stage 162 and the X-stage 164, are linear motors 74A and 74B (not shown in FIG. 9, refer to FIG. 10) for driving the X-stage 164 along the X-guides 170A and 170B in the X-axis direction as the non-scanning direction. In other words, in the present third embodiment, the Y-stage 162 and the X-stage 164 constitutes the wafer stage WST, serving as a sample stage (substrate stage), for holding the wafer W and two-dimensionally moving it in the XY-plane. The driver 72 (refer to FIG. 10), serving as a stage driving mechanism (substrate driving mechanism) for driving the wafer stage WST, includes the linear motors 86A and 86B and the linear motors 74A and 74B.

The linear motors 86A, 86B, 74A, and 74B adopt well-known moving magnet type or moving coil type linear motors.

One ends of reaction frames 172A and 172B and reaction frames 172C and 172D consisting of pairs of L-shaped members, serving as second transmitting members, are fixed to both side-surfaces of the Y-stage 162 in the X-axis direction. Arranged on other ends of the respective reaction frames 172A and 172B and reaction frames 172C and 172D, is a mover 176 of linear actuators 174A and 174B (however, the linear actuator 174B is not shown in FIG. 9, refer to FIG. 10). A stator 178 of the linear actuators 174A and 174B extends along the Y-axis direction on the upper surface of the base plate BP2.

Piezoelectric elements 180 as second damping members are fixed to the respective reaction frames 172A to 172D. Also, in this case, the piezoelectric elements 180 are fixed at positions of the reaction frames 172A to 172D where maximum deflections are caused, respectively, to effectively damp vibrations.

FIG. 10 shows a main portion of a control system in the exposure apparatus according to the present third embodiment. In a manner alike to the control system in FIG. 3, the control system in FIG. 10 is constructed mainly by the main controller 50 serving as a controller. This control system is similar to the above-explained 4 control system in FIG. 3, excluding a point that the linear actuators 174A and 174B are further connected to the output side of the main controller 50.

In this case, when driving the wafer stage WST in the Y-direction at the time of scanning exposure, etc., the main controller 50 controls the linear motors 86A and 86B and the linear actuators 174A and 174B, and drives the reaction frames 172A to 172D integrally with the wafer stage WST. More specifically, in the present third embodiment, a first controller for controlling the driver 72 and the linear actuators 174A and 174B is constructed by the main controller 50 so that the Y-stage 162 and the reaction frames 172A to 172D are integrally moved.

Components except for the stage unit is similar to those of the aforementioned first embodiment. Therefore, the two-dimensional position in the XY-plane of the X-stage 164 is measured by the above-described laser interferometers 90X and 90Y.

In the thus-constituted exposure apparatus according to the present third embodiment, for example, when the X-stage 164 is moved in the cases of stepping between shots, etc., a reaction force of a drive force of the X-stage 164 acts on the Y-stage 162. This reaction force is transmitted to the reaction frames 172A to 172D from the Y-stage 162, thereby vibrating the reaction frames 172A to 172D. The vibrations are damped by the piezoelectric elements 180. This results in sufficiently reducing the reaction force caused at the time of moving the X-stage 164, which is transmitted to the base plate BP2 via the reaction frames 172A to 172D.

Also, in the cases of the scanning exposure, etc., when the wafer stage WST is driven in the scanning direction, a reaction force of the drive force acts on the stage supporting bed 16. The reaction force is transmitted to the reaction frames 84C, 84D, 84E, and 84F from the stage supporting bed 16, thereby vibrating the reaction frames 84C, 84D, 84E, and 84F. However, the vibrations are damped by the piezoelectric elements 85.

Accordingly, in the present third embodiment, it is possible to acquire the advantages equivalent to those of the above-discussed first embodiment.

Incidentally, in the above third embodiment, it is also possible to adopt a structure that the Y-stage 162 is supported by air-levitation with air-pads, etc., the mover of the linear motors is arranged on both side-surfaces of the Y-stage 162 in the X-direction, and the stator of the linear motors is fixed to edges of the reaction frames 172A and 172B and the reaction frames 172C and 172D. Thus, since the wafer stage WST and the stage supporting bed 16 have an independent relationship with respect to the vibration, the reaction force upon driving the wafer stage is not directly transmitted to the stage supporting bed 16. Therefore, for example, even if setting an interferometer for measuring the two-dimensional position of the X-stage 164 on the stage supporting bed 16, the vibration of the stage supporting bed 16 never causes deterioration in positional controllability.

Also, in the above third embodiment, the piezoelectric elements 85 and 180 are connected to the main controller 50. In the same manner as that of the second embodiment, the main controller 50 can control voltages applied to the respective piezoelectric elements 85 and 180 by feed-forward control in accordance with the reaction force caused by driving the X-stage. In such a case, it is possible to suppress occurrence itself of vibrations of the reaction frames. In this case, not only the first controller but also a second controller is constructed by the main controller 50.

Alternatively, in the present third embodiment, electrodes (counter electrodes) at both ends of the piezoelectric elements 85 and 180 can be connected to ground (be earthed) by way of resistors, respectively, whereupon it is possible to actively transduce a mechanical energy, which is generated by vibrations of the reaction frames 84C to 84F and the reaction frames 172A to 172D, into a heat energy, similarly to the foregoing. Also, the piezoelectric elements 85 and 180 can further effectively damp the vibrations of the reaction frames 84C to 84F and the reaction frames 172A to 172D.

Fourth Embodiment

The fourth embodiment of the present invention will be described hereinbelow with reference to FIG. 11. Herein, the same reference numerals are employed for components similar or equivalent to those of the above-stated first embodiment, and a description thereof is simplified or omitted.

Figure 11:
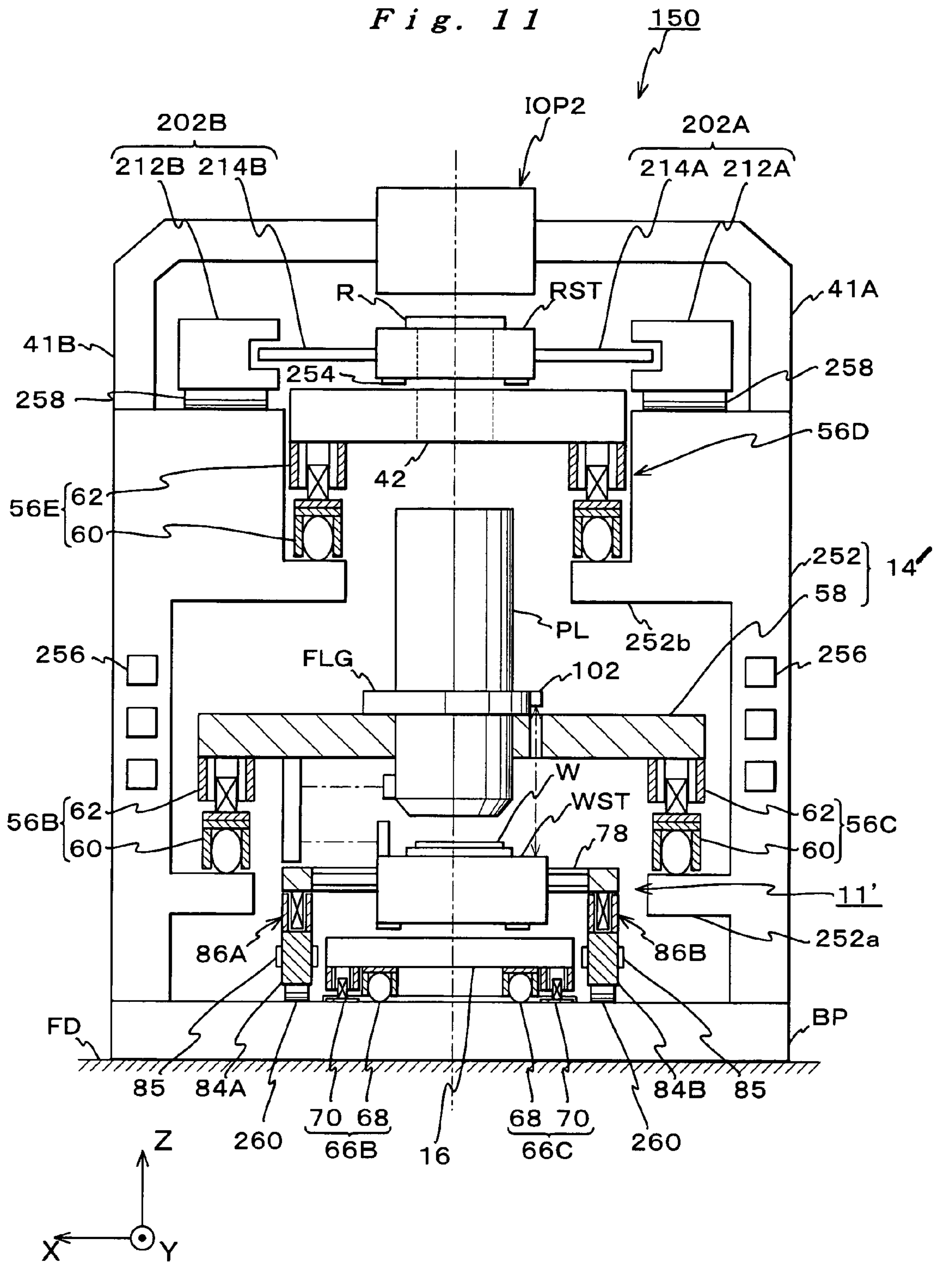
FIG. 11 is a view schematically showing the constitution of an exposure apparatus according to the fourth embodiment of the present invention.

FIG. 11 schematically shows the entire constitution of an exposure apparatus 150 according to the fourth embodiment.

Similarly to the exposure apparatus 10 according to the above-mentioned first embodiment, the exposure apparatus 150 is a scanning stepper which synchronously moves the reticle R and the wafer W and simultaneously transfers circuit patterns of the semiconductor device formed on the reticle onto the wafer W.

The exposure apparatus 150 differs from the exposure apparatus 10 according to the above first embodiment in the constitution of the base plate serving as a reference of the apparatus, the constitution of the main column for supporting the projection optical system, the supporting structure of the Y-linear motors 202A and 202B constructing the driver 44 (refer to FIG. 3) for driving the reticle stage RST, a part of the constitution of a stage unit 11' for two-dimensionally driving the wafer W in the XY-plane, and the like. Other constitution, etc. are similar to the exposure apparatus 10 according to the above-explained first embodiment. Hence, the above different points will be mainly described in the following.

To start with, the present embodiment adopts the base plate BP serving as the reference of the apparatus, which is placed onto the floor surface FD and is rectangular-plate-shaped. A main column 14' and the stage unit 11', etc. are arranged on the base plate BP.

The main column 14' comprises a reaction frame 252, as a first supporting frame, which is set onto the base plate BP, and a barrel supporting bed 58, as a second supporting frame, which is supported almost horizontally via the vibration isolators 56A to 56C (then, the vibration isolator 56A in the depth of FIG. 11 is not shown) onto a first step portion 252*a* extending toward the inside near a lower end portion of the reaction frame 252.

A second step portion 252*b* is extended toward the inside near an upper end portion of the reaction frame 252. A reticle base supporting bed 42 is supported almost horizontally via the vibration isolators 56D to 56G (then, the vibration isolators 56F and 56G in the depth of FIG. 11 are not shown) comprising the air mounts 60 and the voice coil motor 62 in similar to the vibration isolators 56A to 56C onto the step portion 252*b*.

In the present embodiment, the reticle stage RST is supported by air levitation above the reticle base supporting bed 42 by a plurality of air bearings (air pads) 254 serving as non-contact bearings fixed on the bottom surface of the reticle stage RST with a clearance around several microns.

Note that a practical-used reticle stage RST is a coarse and fine movement stage having a reticle coarse movement stage and a reticle fine movement stage in a similar manner to that of the foregoing first embodiment.

A pair of supporting members 41A and 41B for supporting the second partial illumination optical system IOP2 are arranged onto an upper surface of the reaction frame 252. A plurality of damping members 256 comprising piezoelectric elements such as piezo ceramic elements, in similar to the above damping members 85, are vertically arranged and mounted to side surfaces on both sides of legs in the Y-direction (in the depth side and on the front side in FIG. 11) on both sides of the reaction frame 252 in the X-direction (at the right and left in FIG. 11), respectively. One of the damping members 256, which are individually aligned vertically and arranged, is disposed near a position at which a strain caused in the reaction frame becomes maximum.

The Y-linear motors 202A and 202B comprise: movers 214A and 214B which contain coils and extend in the Y-direction and are integrally arranged almost in the center portion of both-side surfaces in the Z-direction of the reticle stage RST in the X-direction, respectively; and a pair of stators 212A and 212B which have U-shaped sectional surfaces and extend in the Y-direction to opposite to the respective the movers 214A and 214B. The stators 212A and 212B comprise: stator yokes; and a large number of permanent magnets which are arranged along extending directions of the stator yokes at a predetermined interval and generate an alternating field, respectively. That is, in the present embodiment, the mover 214A and the stator 212A constitute the linear motor 202A of the moving-coil type, and the mover 214B and the stator 212B constitute the linear motor 202B of the moving-coil type. The movers 214A and 214B are driven in the Y-direction by an electro-magnetic interaction between the movers 214A and 214B and the stators 212A and 212B which are integrally opposed to the reticle stage RST.

Rolling guides 258 are individually interposed between the stators 212A and 212B and the upper surface of the reaction frame 252. The rolling guides 258 is constructed by arranging a plurality of rollers at a predetermined interval in the Y-direction, axes of which extend in the X-direction and which rotate around each axis. The stators 212A and 212B are movable to the reaction frame 252 in the Y-direction by rotation of the rollers. Also, one ends of a pair of return springs for return to an original position (omitted in the figure) are connected to both sides of the individual stators 212A and 212B in the Y-direction, and the other ends of the pair of return springs for return to the original position are connected to the reaction frame 252. The reticle stage RST is a guideless stage having no movement guide in the X- and Y-directions.

The stage unit 11' differs from the above-mentioned stage unit 11 in the following points. In other words, rolling guides 260 having a similar constitution to that of the above rolling guides 258 are individually interposed between the base plate BP and the reaction frames 84A and 84B to which the damping members 85 are arranged. Return springs for return to an original position similar to the foregoing are connected to both sides of the reaction frames 84A and 84B (or the stators 82A and 82B) in the Y-direction.

Other components, etc. are constructed in a manner alike to the exposure apparatus 10 according to the above first embodiment.

In the thus-constructed exposure apparatus 150 according to the present fourth embodiment, operation in an exposure processing step is implemented, similarly to the above-mentioned exposure apparatus 10. For instance, upon scanning exposure, if the reticle stage RST and the wafer stage WST are driven in the scanning direction, reaction forces of individual drive forces cause the stators 212A and 212B to move in a direction opposite to the reticle stage RST, and also cause the reaction frames 84A and 84B to move in a direction opposite to the wafer stage WST. As a result, it is capable of effectively suppressing decrease in reaction forces and occurrence of an offset load originating from the center of gravity movement of the system including the respective stages. As a consequence, a counter stage on the wafer side is constructed by the reaction frames 84A and 84B. A counter stage on the reticle side is constructed by the stators 212A and 212B. Separately from the stators, a counter stage, to which the stator is arranged, can be arranged.

When a friction force between the reticle stage RST and the reticle base supporting bed 42 is null and when a friction force among the reticle stage RST (mover 214A), the stator 212A, and the reaction frame 252 is null, these cases obey the law of conservation of momentum and the reaction force can be completely absorbed and the offset load originating from the above movement center of gravity can also be null.

However, actually, the rolling guides 258 exist between the stators 212A and 212B and the reaction frame 252 and, therefore, the friction force between the stators 212A and 212B and the reaction frame 252 is not null. Because the reticle stage RST slightly differs from the stators 212A and 212B in the movement direction, etc., a fine vibration in directions of six degrees of freedom of the reaction frame 252 remains. However, the damping members 256 damp the remaining vibration (and the reaction force owing thereto) of the reaction frame 252 and, therefore, it is possible to almost certainly prevent the reaction force upon movement of the reticle stage RST from being transmitted to other parts via the reaction frame 252. The wafer stage WST can be similar to the foregoing.

Accordingly, in the exposure apparatus 150 according to the present embodiment, it is possible to effectively suppress the reaction force upon driving the stage and the vibrations of the reaction frames 252 and 84A and 84B arising therefrom and to almost certainly prevent the vibration from becoming a vibration factor of the projection optical system PL. The positional shift of the pattern to be transferred or the image blur caused, etc., due to the vibration of the projection optical system PL, can be effectively suppressed, and the exposure accuracy can also be improved. The positional controllability of the reticle stage RST and the wafer stage WST can be improved. With regard to both of the stages, acceleration, velocity, and size can be increased, thereby improving throughput. Then, the present fourth embodiment may be applied not only to the reticle stage RST but also to the wafer stage WST.

It is to be noted that an exposure apparatus similar to the exposure apparatus 150 of the above fourth embodiment is disclosed in, for example, PCT patent application PCT/JP99/05539 (filing date: Oct. 7, 1999). As long as the national laws in designated states or elected states, to which this international application is applied, permit, the disclosure cited in the PCT patent application PCT/JP99/05539 are fully incorporated herein by reference.

The above first to fourth embodiments exemplify the case wherein the stage unit according to the present invention is applied to the stage unit in the exposure apparatus, and is not limited thereto. If the stage unit is a precision machine, etc. necessary for positional control (including positioning) of the sample with high accuracy, it can be preferably applied. Moreover, proper combination of the first to fourth embodiments can be applied to the reticle stage RST and the wafer stage WST.

Also, the above embodiments exemplify the case wherein the present invention is applied to the exposure apparatus which consists of the stage supporting bed (stage base) and the main column, separately. However, the present invention can also be preferably applied to an exposure apparatus that the stage base constitutes a part of the main column (for instance, that the stage base is hung on and supported to the barrel supporting bed).

Also, in the embodiments described above, the case is described where the present invention is applied to the scanning stepper. The present invention, however, can be preferably applied to a reduction projection exposure apparatus based on a step-and-repeat method that transfers the mask pattern onto the substrate with the mask and substrate in a stationary state and sequentially steps the substrate. Or, the present invention can be preferably applied to a proximity exposure apparatus, which does not use a projection optical system and transfers the mask pattern onto the substrate with the mask in close contact with the substrate.

In addition, the present invention is not limited only to an exposure apparatus for manufacturing semiconductor devices, but can also be widely applied to an exposure apparatus for liquid crystal displays which transfers a liquid crystal display device pattern onto a square-shaped glass plate, or an exposure apparatus to manufacture thin-film magnetic heads.

As the illumination light of the exposure apparatus in the present invention, it is not limited to the ArF excimer laser beam, and a g-line (436 nm), an i-line (365 nm), a KrF excimer laser beam (248 nm), an $F_2$ laser beam (157 nm), or a charged particle beam such as an X-ray or an electron beam can be used. For example, in the case of using an electron beam, as the electron gun, a thermionic emission type such as lanthanum hexaboraide ($LaB_6$) or tantalum (Ta) can be used.

Furthermore, in the case of using an electron beam, a structure with a mask may be employed, or the structure where the pattern is formed on the substrate with the electron beam drawing directly without using a mask may be employed. That is, if the exposure apparatus is an electron beam exposure apparatus which uses an electron optical system, the present invention is applicable to any of the types, such as the pencil beam method, the variable beam shaping method, the cell projection method, the blanking aperture method, and the EBPS.

In addition, the magnification of the projection optical system, is not limited to the reduction system, and may be an equal magnification and a magnifying system. As the projection optical system, in the case of using far ultraviolet light such as an excimer laser, as the glass material, material such as quartz or fluorite which has transmittance to far ultraviolet light is used. When an $F_2$ laser or an X-ray is used, the optical system is to be a reflection/refraction type or a reflection type (the reticle used is also to be a reflection type). In the case of using an electron beam, as the optical system, an electron optical system made up of an electron lens and a deflector can be used. As a matter of course, the optical path where the electron beam passes through, is to be in a vacuumed state.

Also, with an exposure apparatus using vacuum ultraviolet light (VUV) which has a wavelength of around 200 nm and under, the reflection/refraction system may be used as the projection optical system. As this reflection/refraction type projection optical system, for example, a reflection/refraction system having a beam splitter and concave mirror as reflection optical elements, which is disclosed in detail in, for example, Japanese Patent Laid Open No. 08-171054 and the corresponding U.S. Pat. No. 5,668,672, Japanese Patent Laid Open No. 10-20195 and the corresponding U.S. Pat. No. 5,835,275 can be used. Or, a reflection/refraction system having a concave mirror and the like as reflection optical elements without using any beam splitter, which is disclosed in detail in, for example, Japanese Patent Laid Open No. 08-334695 and the corresponding U.S. Pat. No. 5,689,377, Japanese Patent Laid Open No. 10-3039 and the corresponding U.S. patent application Ser. No. 873,605 (application date: Jun. 12, 1997). As long as the national laws in designated states or elected states, to which this international application is applied, permit, the disclosures cited above are fully incorporated herein by reference.

Alternatively, a reflection/refraction system in which a plurality of refracting optical elements and two mirrors (a concave mirror serving as a main mirror, and a sub-mirror serving as a back-mirror forming a reflection plane on the side opposite to an incident plane of a refracting element or a parallel flat plate), which details are disclosed in, U.S. Pat. No. 5,031,976, U.S. Pat. No. 5,488,229, and U.S. Pat. No. 5,717,518, may be used. The two mirrors are arranged on an axis, and an intermediate image of the reticle pattern formed by the plurality of refracting optical elements is re-formed on the wafer by the main mirror and the sub-mirror. In this reflection/refraction system, the main mirror and the sub-mirror are arranged in succession to the plurality of refracting optical elements, and the illumination light passes through a part of the main mirror and is reflected on the sub-mirror and then the main mirror. It then proceeds further through a part of the sub-mirror and reaches the wafer. As long as the national laws in designated states or elected states, to which this international application is applied, permit, the disclosures cited above are fully incorporated herein by reference.

Furthermore, as a reflection/refraction type projection optical system, a reduction system can be used which projection magnification is ¼ or ⅕, has a circular image field, and is double telecentric on both the object plane side and image plane side. In the case of a scanning exposure apparatus comprising this reflection/refraction type projection optical system, the irradiation area of the illumination light can be in the field of the projection optical system having the optical axis of the projection optical system roughly as the center, and be determined in a rectangular slit shape extending in the direction almost perpendicular to the scanning direction of the reticle or the wafer. With the scanning exposure apparatus comprising such a reflection/refraction type projection optical system, even, for example, in the case of using an $F_2$ laser beam having a wavelength of 157 nm as the illumination light for exposure, a fine pattern of around a 100 nm L/S pattern can be transferred with high precision onto the wafer.

In addition, as the driving system of the wafer stage and the reticle stage, linear motors which details are disclosed in, U.S. Pat. No. 5,623,853 and U.S. Pat. No. 5,528,118, may be used. In such a case, either an air levitation type which uses air bearings or a magnetic levitation type which uses the Lorentz force or a reactance force may be used. As long as the national laws in designated states or elected states, to which this international application is applied, permit, the disclosures cited above are fully incorporated herein by reference.

Also, in the case of using a planar motor for the driver of the stage, either one of the magnetic unit or the armature unit can be connected to the stage, and the remaining of the magnetic unit or the armature unit can be arranged on the movement surface side of the stage.

Further, the stage may be the type which moves along a guide, or it may be a guideless type which does not require any guides.

The reaction force generated with the movement of the 25 reticle stage may be mechanically released to the floor FD (ground) by using a frame member, as is disclosed, for example, in Japanese Patent Laid Open No. 08-330224 and the corresponding U.S. Pat. No. 5,874,820. As long as the national laws in designated states or elected states, to which this international application is applied, permit, the disclosures cited above are fully incorporated herein by reference.

The exposure apparatus in the above embodiment can be made by incorporating the illumination optical system made up of a plurality of lenses and the projection optical system into the main body of the exposure apparatus, performing optical adjustment, while incorporating the reticle stage or wafer stage that are made up of various mechanical components into the main body of the exposure apparatus, and connecting the wiring and piping, and furthermore, performing total adjustment (electrical adjustment, operational adjustment). The exposure apparatus is preferably made in a clean room in which temperature, degree of cleanliness, and the like are controlled.

In addition, a semiconductor device is manufactured through the following steps: a step of designing the function and performance of the device; a step of manufacturing a reticle based on the design step; a step of manufacturing a wafer from a silicon material; a step of transferring a reticle pattern onto the wafer by using the exposure apparatus of the above embodiment; a step of assembling the device (including dicing, bonding, and packaging process), an inspection step, and the like.

The following is a detailed description of the device manufacturing method.

Device Manufacturing Method

A device manufacturing method using the exposure apparatus described above in a lithographic process will be described next.

Figure 12:
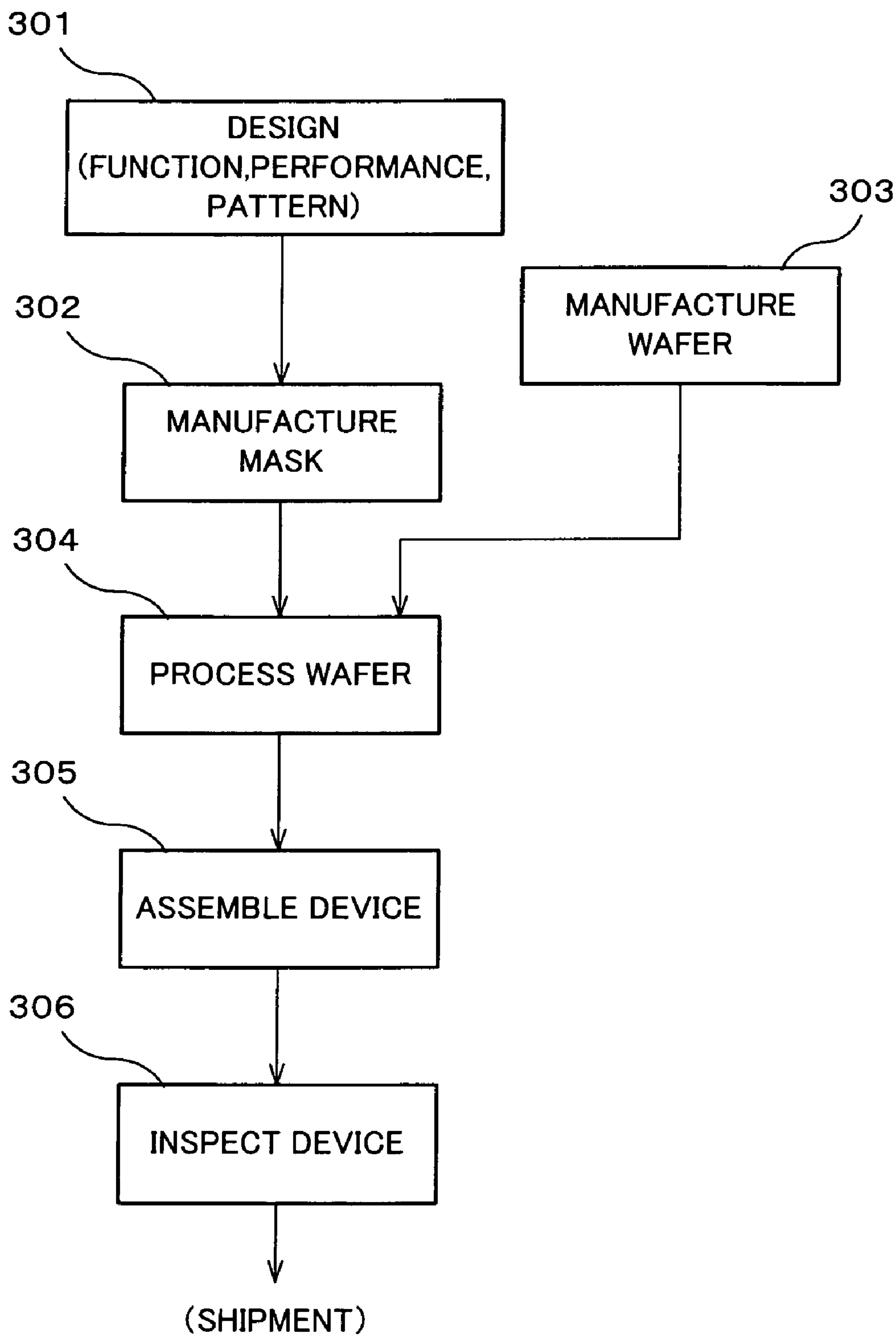
FIG. 12 is a flowchart for illustrating an embodiment of a device manufacturing method according to the present invention.

FIG. 12 is a flowchart showing an example of manufacturing a device (a semiconductor chip such as an IC or LSI, a liquid crystal panel, a CCD, a thin magnetic head, a micromachine, or the like). As shown in FIG. 12, in step 301 (design step), function/performance is designed for a device (e.g., circuit design for a semiconductor device) and a pattern to implement the function is designed. In step 302 (mask manufacturing step), a mask (reticle) on which the designed circuit pattern is formed is manufactured. In step 303 (wafer manufacturing step), a wafer is manufacturing by using a silicon material or the like.

In step 304 (wafer processing step), an actual circuit and the like are formed on the wafer by lithography or the like using the mask and wafer prepared in steps 301 to 303, as will be described later. In step 305 (device assembly step), a device is assembled using the wafer processed in step 304. Step 305 includes processes such as dicing, bonding, and packaging (chip encapsulation).

Finally, in step 306 (inspection step), a test on the operation of the device, durability test, and the like are performed. After these steps, the device is completed and shipped out.

Figure 13:
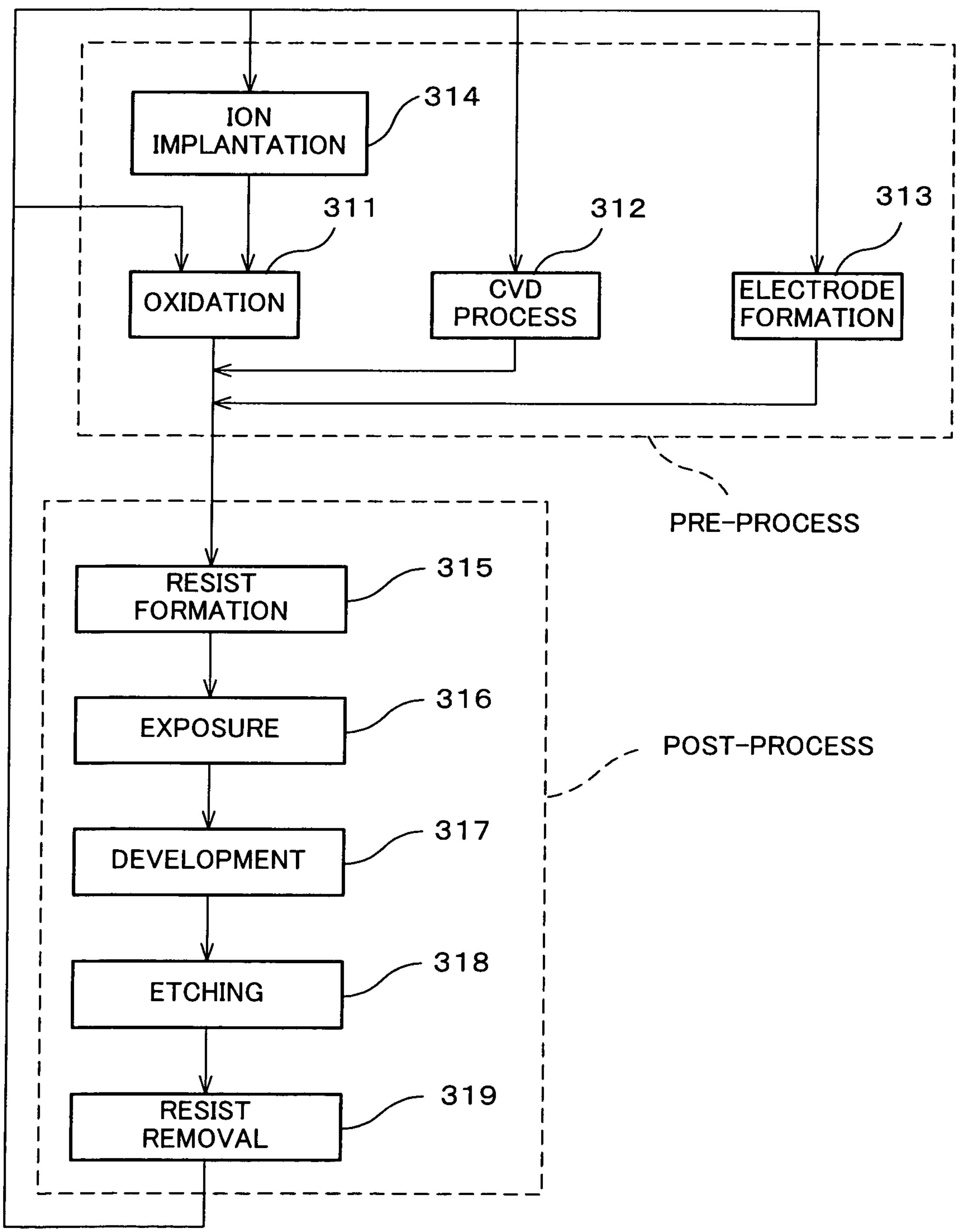
FIG. 13 is a flowchart showing processes in step 304 in FIG. 12.

FIG. 13 is a flowchart showing a detailed example of step 304 described above in manufacturing the semiconductor device. Referring to FIG. 13, in step 311 (oxidation step), the surface of the wafer is oxidized. In step 312 (CVD step), an insulating film is formed on the wafer surface. In step 313 (electrode formation step), an electrode is formed on the wafer by vapor deposition. In step 314 (ion implantation step), ions are implanted into the wafer. Steps 311 to 314 described above constitute a pre-process for the respective steps in the wafer process and are selectively executed based on the processing required in the respective steps.

When the above pre-process is completed in the respective steps in the wafer process, a post-process is executed as follows. In this post-process, first, in step 315 (resist formation step), the wafer is coated with a photosensitive agent. Next, as in step 316, the circuit pattern on the mask is transcribed onto the wafer by the above exposure apparatus and method. Then, in step 317 (developing step), the exposed wafer is developed. In step 318 (etching step), an exposed member on a portion other than a portion where the resist is left is removed by etching. Finally, in step 319 (resist removing step), the unnecessary resist after the etching is removed.

By iteratively performing these pre-process and post-process steps, multiple circuit patterns are formed on the wafer.

As described above, according to the device manufacturing method of the present embodiment, the exposure apparatus in each of the above embodiments is used in the exposure process (step 316). This makes it possible to improve the exposure accuracy, which in turn leads to producing devices having high integration.

INDUSTRIAL APPLICABILITY

As is described, the stage unit according to the present invention is suitable to the stage for the sample of the precision machine requiring the positional controllability of the sample with high accuracy. The exposure apparatus according to the present invention is suitable to overlay a plurality of layers of a fine pattern onto the substrate such as a wafer in the lithography process to manufacture microdevices such as an integrated circuit. Further, the device manufacturing method according to the present invention is suited to manufacture a device having a fine pattern.

What is claimed is:

1. A stage unit comprising:

a sample stage that holds a sample, the sample stage being movably supported by a stage base;

a stage driving mechanism that drives the sample stage in at least one direction;

a first transmitting member to which at least one part of the stage driving mechanism is connected and a reaction force caused by driving the sample stage is transmitted, the first transmitting member being arranged independently of the stage base; and a first damping member that is arranged on the first transmitting member and damps a vibration of the first transmitting member, the first damping member being different from a base that supports the first transmitting member and being arranged at a position where a maximum strain of the first transmitting member is caused.

2. A stage unit according to claim 1, wherein the stage driving mechanism comprises a stator arranged on the first transmitting member and a mover that is driven together with the sample stage by an electromagnetic interaction between the stator and the mover.

3. A stage unit according to claim 1, wherein the first damping member is a piezoelectric element having electrodes at both ends and each of the electrodes is grounded via a resistor.

4. A stage unit according to claim 1, wherein the first damping member is an electromechanical transducer that generates a mechanical strain by applying an electric energy, and the stage unit further comprises a controller that controls the electromechanical transducer in accordance with a reaction force caused by driving the sample stage.

5. A stage unit according to claim 4, wherein the controller controls the electromechanical transducer based on an instructing value of a drive force of the sample stage.

6. A stage unit according to claim 5, wherein the controller feed-forward controls a voltage applied to the electromechanical transducer so that the electromechanical transducer generates a deflection deformation to cancel a deformation, which is caused in the first transmitting member by the reaction force, in the first transmitting member.

7. A stage unit according to claim 1, further comprising:

a stage base that movably supports the sample stage.

8. A stage unit according to claim 1, wherein the sample stage comprises:

a coarse stage that moves in the one direction; and a fine stage that holds the sample and is movable relative to the coarse stage.

9. A stage unit according to claim 8, further comprising:

a second transmitting member in which a reaction force caused by driving the fine stage is transmitted via the coarse stage;

a linear actuator that drives the second transmitting member in the one direction;

a second damping member that is arranged on the second transmitting member and damps a vibration of the second transmitting member due to the reaction force caused by driving the fine stage; and a first controller that controls the stage driving mechanism and the linear actuator so that the coarse stage and the second transmitting member integrally move in the one direction.

10. A stage unit according to claim 9, wherein the second damping member is arranged to a position where a maximum strain of the second transmitting member is caused.

11. A stage unit according to claim 9, wherein the second damping member is an electromechanical transducer that generates a mechanical strain by applying an electric energy, and the stage unit further comprises a second controller that controls the electromechanical transducer in accordance with the reaction force caused by driving the fine stage.

12. A stage unit according to claim 11, wherein the second controller controls the electromechanical transducer based on an instructing value of a drive force of the fine stage.

13. A stage unit according to claim 12, wherein the second controller feed-forward controls a voltage applied to the electromechanical transducer so that the electromechanical transducer generates a deflection deformation to cancel a deformation, which is caused in the second transmitting member by the reaction force, in the second transmitting member.

14. An exposure apparatus comprising a mask stage unit including a mask stage that moves and holds a mask, as a sample, having a pattern, and a substrate stage unit including a substrate stage that moves and holds a substrate, as a sample, onto which the pattern is transferred, wherein the stage unit according to claim 1 is used for at least one of the mask stage unit and the substrate stage.

15. An exposure apparatus according to claim 14, further comprising:

a projection optical system that is arranged between the mask and the substrate and projects the pattern onto the substrate.

16. An exposure apparatus according to claim 15, further comprising:

a holder that is independent of the first transmitting member with respect to a vibration and holds the projection optical system.

17. An exposure apparatus according to claim 14, further comprising:

a controller that synchronously moves the mask and the substrate, when the pattern is transferred onto the substrate.

18. An exposure apparatus that forms a pattern on a substrate while a stage moves, comprising:

a stage base that movably supports the stage;

a counter stage that moves in a direction opposite to the stage in accordance with movement of the stage;

a first supporting frame that is arranged independently of the stage base and movably supports the counter stage; and a damping member that is arranged on the first supporting frame and damps a vibration of the first supporting frame, the damping member being different from a base that supports the first supporting frame.

19. An exposure apparatus according to claim 18, wherein the stage is a substrate stage that holds the substrate and moves.

20. An exposure apparatus according to claim 18, wherein the stage is a mask stage that holds a mask on which the pattern is formed and moves.

21. An exposure apparatus according to claim 18, further comprising:

an original-position return mechanism that returns a position of the counter stage to an origin.

22. An exposure apparatus according to claim 18, further comprising:

a projection optical system that projects the pattern onto the substrate; and a second supporting frame that is arranged independently of the first supporting frame with respect to a vibration and supports the projection optical system.

23. A device manufacturing method including a lithography process, wherein exposure is performed in the lithography process by using the exposure apparatus according to claim 18.

24. A device manufactured by the device manufacturing method according to claim 23.

25. An exposure apparatus according to claim 18, wherein the damping member comprises a piezoelectric element.

26. An exposure apparatus according to claim 18, wherein the damping member comprises an electro-mechanism transducer that generates a mechanical strain.

27. An exposure apparatus according to claim 18, wherein the damping member is arranged at a position where a maximum strain of the first supporting frame is caused.

28. A stage apparatus having a movable stage, comprising:

a stage base that movably supports the moveable stage;

a counter stage that moves in a direction opposite to the movable stage in accordance with movement of the movable stage a first supporting frame that is arranged independently of the stage base and movably supports the counter stage; and a damping member that is arranged on the first supporting frame and damps a vibration of the first supporting frame, the damping member being different from a base that supports the first supporting frame.

29. A stage apparatus according to claim 28, further comprising:

a base that is different from the first supporting frame to movably support the movable stage.

30. An exposure apparatus according to claim 28, wherein the damping member is arranged at a position where a maximum strain of the first supporting frame is caused.

31. A stage apparatus according to claim 28, further comprising:

an adjuster that adjusts a position of the counter stage.

32. A device manufacturing method comprising:

moving a stage that holds a substrate, the stage being movably supported by a stage base;

moving a counter stage in a direction opposite to a movement direction of the stage in response to a reaction force generated by movement of the stage;

damping a vibration of a supporting frame that movably supports the counter stage, by using a damping member arranged on the supporting frame, the supporting frame being arranged independently of the stage base; and transferring a pattern onto the substrate.

33. The method according to claim 32, wherein the damping comprises:

damping the vibration of the supporting frame by a damping member arranged at a position where a maximum strain of the supporting frame is caused.

34. The method according to claim 32, wherein the damping comprises:

damping the vibration of the supporting frame by the damping member comprising a piezoeletric element.

35. A device manufacturing method comprising:

moving a stage that holds a mask having a pattern, the stage being movably supported by a stage base;

moving a counter stage in a direction opposite to a movement direction of the stage in response to a reaction force generated by movement of the stage;

damping a vibration of a supporting frame that movably supports the counter stage, by using a damping member arranged on the supporting frame, the supporting frame being arranged independently of the stage base; and transferring the pattern onto the substrate.

36. The method according to claim 35, wherein the damping comprises:

damping the vibration of the supporting frame by a damping member arranged at a position where a maximum strain of the supporting frame is caused.

37. The method according to claim 35, wherein the damping comprises:

damping the vibration of the supporting frame by the damping member comprising a piezoeletric element.

* * * * *

UNITED STATES PATENT AND TRADEMARK OFFICE

CERTIFICATE OF CORRECTION

PATENT NO. : 6,999,162 B2
APPLICATION NO. : 09/830684
DATED : February 14, 2006
INVENTOR(S) : Takahashi It is certified that error appears in the above-identified patent and that said Letters Patent is hereby corrected as shown below:

On the title page, Item (75), the inventor's residence is incorrect. Item (75) should read:

-- (75) Inventor: Masato Takahashi, Kumagaya (JP) --

Signed and Sealed this

Twenty-ninth Day of August, 2006

JON W. DUDAS
*Director of the United States Patent and Trademark Office*